(12) United States Patent
Shoji

(10) Patent No.: US 6,870,590 B2
(45) Date of Patent: Mar. 22, 2005

(54) ELECTROOPTICAL UNIT WITH A FLEXIBLE BOARD AND ELECTRONIC APPARATUS

(75) Inventor: Hitoshi Shoji, Matsumoto (JP)

(73) Assignee: Seiko Epson Corporation (JP)

( * ) Notice: Subject to any disclaimer, the term of this patent is extended or adjusted under 35 U.S.C. 154(b) by 96 days.

(21) Appl. No.: 09/925,939

(22) Filed: Aug. 9, 2001

(65) Prior Publication Data

US 2002/0044329 A1 Apr. 18, 2002

(30) Foreign Application Priority Data

| Aug. 10, 2000 | (JP) | ................................. 2000-242734 |
| Aug. 24, 2000 | (JP) | ................................. 2000-254365 |
| Jun. 29, 2001 | (JP) | ................................. 2001-199704 |

(51) Int. Cl.[7] .......................................... G02F 1/1345
(52) U.S. Cl. ..................... 349/152; 349/149; 349/150
(58) Field of Search ................................ 349/149–152

(56) References Cited

U.S. PATENT DOCUMENTS

| 5,959,713 | A | * | 9/1999 | Kobayashi | .................. 349/192 |
| 6,191,838 | B1 | * | 2/2001 | Muramatsu | .................. 349/149 |
| 6,411,359 | B1 | * | 6/2002 | Kobayashi et al. | ......... 349/149 |
| 6,456,353 | B1 | * | 9/2002 | Chen | .......................... 349/150 |
| 6,507,384 | B1 | * | 1/2003 | Endo et al. | ................. 349/149 |
| 6,519,021 | B1 | * | 2/2003 | Aruga | ........................ 349/152 |
| 6,665,037 | B2 | * | 12/2003 | Hagiwara | .................... 349/148 |
| 6,675,470 | B2 | * | 1/2004 | Muramatsu | .................. 29/832 |
| 2001/0033355 | A1 | * | 10/2001 | Hagiwara | .................... 349/152 |
| 2002/0018169 | A1 | * | 2/2002 | Kato | .......................... 349/149 |

FOREIGN PATENT DOCUMENTS

| JP | 04-020933 A | * | 1/1992 |
| JP | 5-88195 | * | 4/1993 |
| JP | 5-190600 | | 7/1993 |
| JP | 08-088062 | | 4/1996 |
| JP | 8-248432 | | 9/1996 |
| JP | 09-318967 | | 12/1997 |
| JP | 11-274349 | | 10/1999 |
| JP | 2000-031614 | | 1/2000 |
| JP | 2000-133904 | | 5/2000 |
| JP | 2000-349401 | | 12/2000 |
| JP | 2000-349402 | | 12/2000 |

* cited by examiner

Primary Examiner—Tarifur R. Chowdhury
(74) Attorney, Agent, or Firm—Harness, Dickey & Pierce, P.L.C.

(57) ABSTRACT

In an electrooptical unit 100 mounted in a mobile phone, a flexible board 70 is mounted to a liquid crystal panel 400 by means of an anisotropic conductive film, and rear-side terminals of the flexible board 70 are electrically connected with the terminals of the liquid crystal panel 400 formed from ITO film. In the flexible board 70, capacitors 91 are mounted by means of soldering with front-side terminals 72 which are electrically connected with the rear-side terminals via through holes. The front-side terminals 72 are compressedly connected to connector electrodes of a rubber connector for electrically connecting with a circuit board.

26 Claims, 16 Drawing Sheets

(A)

(B)

(A)

(B)

(A)

(B)

Prior Art

Prior Art

ELECTROOPTICAL UNIT WITH A FLEXIBLE BOARD AND ELECTRONIC APPARATUS

BACKGROUND OF THE INVENTION

1. Technical Field of the Invention

The present invention relates to an electrooptical unit having an electrooptical panel and a circuit board overlapped and disposed therein, and to an electronic apparatus which uses the electrooptical unit. More particularly, the invention relates to a structure of electrical connection to panel-side terminals formed on the electrooptical panel.

2. Description of the Related Art

Various electronic apparatus including mobile phones such as shown in FIG. 2, are comprised of a lower case 6, a circuit board 7 formed with various electrical circuits for this mobile phone 1 to function, an illuminating unit 10, a light diffusing sheet 8, a liquid crystal panel 400 as an electrooptical panel for carrying out various display, and an upper case 9, which are overlapped on top of each other in that order. The illuminating unit 10 is comprised of a light source 11 constituted of an LED or the like, a light guide plate 12, a first reflecting member 15, and a sheet-like second reflecting member 17.

In the illuminating unit 10, the light guide plate 12 is formed with an active area 121 as a rectangular concave portion for disposing the liquid crystal panel 400 therein. In the active area 121, in the corner at the front end of a bottom wall 124, a rectangular through hole 125 for electrically connecting the liquid crystal panel 400 with the circuit board 7 is formed. In the first reflecting member 15, three side wall portions 151, 152, 153 enclosing the periphery of the rectangular active area 121 of the light guide plate 12 on three sides and a bottom wall portion 154, which is overlapped under the bottom face of the active area 121, are formed. A rectangular through hole 155 is also formed in the bottom wall portion 154 at a position where the through hole 125 of the light guide plate 12 overlaps therewith.

Accordingly, as shown in FIG. 15, at the upper side of the circuit board 7, when an electrooptical unit 100 is constituted of the first reflecting member 15, the light guide plate 12, the light diffusing sheet 8, and the liquid crystal panel 400 being overlapped on top of each other, although the first reflecting member 15 and the light guide plate 12 are interposed between the circuit board 7 and the liquid crystal panel 400, the circuit board 7 and the liquid crystal panel 400 face each other via the through holes 125 and 155. Accordingly, when a rubber connector 60 is made to be sandwiched and held between the circuit board 7 and the liquid crystal panel 400, the connector electrodes of the rubber connector 60 come into contact with and are pressed to I/O terminals 481 of the liquid crystal panel 400 by the elasticity, and come into contact with and are pressed to I/O terminals 781 of the circuit board 7 by the elasticity. Accordingly, it is possible to electrically connect the I/O terminals 481 and 781 together between the liquid crystal panel 400 and the circuit board 7.

In the electrooptical unit 100 structure as described above, in the liquid crystal panel 400, as shown in FIG. 16, liquid crystal (not shown) is held between a first transparent substrate 410 and a second transparent substrate 420 adhered together with a predetermined gap being interposed therebetween. Further, on the sides of the first transparent substrate 410 and the second transparent substrate 420 facing each other, electrode patterns (not shown) are formed of ITO film (Indium Tin Oxide; a transparent conductive film).

Herein, in an area 425 of the second transparent substrate 420 extending past the first transparent substrate 410, by means of an anisotropic conductive film which is formed using the forming process of the electrode patterns, terminals (not shown) for COG-mounting a driver IC 490 by means of an anisotropic conductive material, the I/O terminals 481 for inputting and outputting signals to the driver IC 490, and terminals (not shown) for mounting voltage-boosting capacitors 91, which are mounted outside the driver IC 490 by means of an anisotropic conductive material, are formed. The I/O terminals 481 are, as described while referring to FIG. 15, electrically connected with the I/O terminals 781 of the circuit board 7 via the rubber connector 60.

However, in a conventional electrooptical unit 100, the terminals formed in the liquid crystal panel 400 are made of an ITO film, which is formed at the same time as the electrode patterns for driving pixels, and since such an ITO film has a large contact resistance and a large unevenness in film thickness, when electronic components are electrically connected with the liquid crystal panel 400, the following disadvantages may often occur.

First of all, as the terminals having the surface mount type capacitors 91 mounted thereon are formed of ITO film, such disadvantages as a large contact resistance, and varying circuit constants may often occur.

Further, as the I/O terminals 781 of the circuit board 7 are gold plated on the surface thereof, at the points where they come into contact with the connector electrodes of the rubber connector 60, the contact resistance is small while the rubber connector 60 is compressedly connected therebetween and resistance variation over time hardly occurs; whereas, as the I/O terminals 481 of the liquid crystal panel 400 are formed of ITO film, at the points where the I/O terminals 481 of the liquid crystal panel 400 come into contact with the connector electrodes of a rubber connector 60, disadvantages occur such as the contact resistance being large only while being compressedly connected therebetween and the resistance increasing as time passes. Such contact resistance problems, when display is carried out by means of the liquid crystal panel 400, cause problems such as the panel not illuminating or illuminating dimly.

Furthermore, in the electrooptical unit 100, it is necessary to extend many electrode patterns from the driver IC 490 to an image display area 401 of the liquid crystal panel 400. Furthermore, as the periphery of the mounting area of the driver IC 490 contributes substantially little to the display, there is a demand, to reduce these areas formed with terminals by reducing the pitch of the I/O terminals 481.

However, as the rubber connector 60, which electrically connects the I/O terminals 481 of the liquid crystal panel 400 with the I/O terminals 781 of the circuit board 7, is structured such that the connector electrodes elastically come into contact with the terminals, it is necessary to provide a considerably large pitch for the connector electrodes. Therefore, conventionally, since it is necessary to also provide a large pitch for the I/O terminals 481 in accordance with the pitch of the connector electrodes of the rubber connector 60, in the liquid crystal panel 400, it is impossible to make the area for forming the I/O terminals 481 smaller. Therefore, in the liquid crystal panel 400, a problem occurs in that it is necessary to provide a large area which does not contribute to the display of images. Furthermore, as the wiring length of the electrode patterns is large, another problem occurs in that the resistance thereof becomes large, and the voltage of the input signal is decreased.

In view of these disadvantages as described above, an object of the present invention is to provide an electrooptical unit which enables electronic components to be electrically connected satisfactorily to the electrooptical panel, and an electronic apparatus using this electrooptical unit.

Furthermore, another object of the present invention is, even when the I/O terminals of the electrooptical panel is formed with a small pitch, to provide an electrooptical unit which enables electrical connection to be established with the circuit board via a rubber connector or the like, and an electronic apparatus using this electrooptical unit.

SUMMARY OF THE INVENTION

In order to solve the problems described above, the present invention is characterized by: an electrooptical unit comprising an electrooptical panel and a circuit board overlapped with the electrooptical panel with a predetermined space being interposed therebetween, the electrooptical panel and the circuit board being provided with panel-side terminals and circuit board-side terminals at the respective sides facing each other; wherein the electrooptical unit has a flexible board at the rear side oriented to the electrooptical panel and overlapped with the same; the flexible board includes a plurality of front-side terminals formed on the front side thereof, a plurality of rear-side terminals formed on the rear side thereof and a plurality of through holes for electrically connecting the front-side terminals and the rear-side terminals; the rear-side terminals are electrically connected with the panel-side terminals via conductive material; and the front-side terminals are electrically connected with electronic components.

In the present invention, the rear-side terminals of the flexible board are electrically connected with the panel-side terminals of the electrooptical panel, and surface mount type electronic components such as capacitors and a rubber connector are electrically connected to the front-side terminals of the flexible board. Herein, the flexible board has flexibility. When the rear-side terminals of the flexible board are connected electrically with the panel-side terminals of the electrooptical panel, or when the electronic components are connected electrically to the front-side terminals of the flexible board, the unevenness of the film thickness of the panel-side terminals can be absorbed, regardless of the unevenness of the film thickness of the panel-side terminals. Furthermore, the terminals of the flexible board are, generally, gold plated. Accordingly, when the electronic components such as a surfacemount type capacitor and a rubber connector are connected electrically with the panel-side terminals via the flexible board, problems such as the initial contact resistance being large or the contact resistance increasing over time do not occur, unlike a case where these electronic components are electrically connected with the panel-side terminals.

In the present invention, the flexible board may be overlapped with the electrooptical panel including an area formed with the through holes, or the flexible board may be overlapped entirely with the electrooptical panel. In such a configuration, the size of electrooptical unit including the electrooptical panel and the flexible panel can be reduced.

In the present invention, the area of the flexible board formed with the through holes may extend past the edge of the electrooptical panel. In such a configuration, the area formed with through holes in the flexible board provides a larger area for forming wiring patterns at the rear side and the front side of the flexible board as much as the area extends past the edge of the electrooptical panel. Accordingly, it is easy to electrically connect the panel-side terminals with the front-side terminals of the flexible board which is separately positioned.

In the present invention, for example, the electronic components have first front-side terminals in the terminals at the side sandwiched between the flexible board and the circuit board and a connector having connector electrodes connecting by the elasticity to the circuit board-side terminals. In such a configuration, the connector such as a rubber connector or the like does not come into compressedly direct contact with the panel-side terminals, but is connected electrically with the front-side terminals of the flexible board, and the rear-side terminals which are connected electrically with the front-side terminal via through holes are connected electrically to the panel-side terminals satisfactorily by a conductive material such as an anisotropic conductive material. Herein, the connector electrodes such as the rubber connector or the like come into contact with the front-side terminals of the flexible board. Since the front-side terminals are, generally, plated with gold or the like, at these electrical connection areas, contact resistance is small by only being compressedly connected, and at the same time, resistance changes over time also hardly occur. Herein, the connector electrodes of the rubber connector or the like are compressedly connected with the circuit board-side terminals by the elasticity. Since the circuit board-side terminals are, generally, plated with gold or the like, at these electrical connection areas, contact resistance is small by only being compressedly connected, and at the same time, resistance changes over time also hardly occur. Accordingly, when a display is carried out using the electrooptical panel, such problem as the display not illuminating or illuminating dimly can be prevented due to resistance increasing in an electrical connection area.

In the present invention, the electronic components may include an electrical circuit element surface-mounted on second surface-side terminals in the terminals at the front side. In such a configuration, it is not necessary to form the wiring patterns complexly in the electrooptical panel from a driver IC to the area for mounting electrical circuit elements at the electrooptical side; hence, the layout of the wiring patterns can be made simple. Also, it is not necessary to connect the electrooptical elements directly electrically with the terminals formed of ITO film or the like formed on the electrooptical panel by means of an anisotropic conductive material, and it is sufficient that the electrical circuit element is connected electrically to the terminals formed at the front side of the flexible board by means of soldering or the like. In the electrical connection areas, thus, the contact resistance is small, and resistance changes over time hardly occur.

In the present invention, the electronic components may have a connector having connector electrodes for connecting by the elasticity first front-side terminals in the front-side terminals and the circuit board-side terminals in a state being sandwiched between the flexible board and the electrical circuit, and an electrical circuit element surface-mounted on the second front-side terminals in the front-side terminals.

In the present invention, the electronic panel may have a driver IC COG-mounted thereon, and in this case, the panel-side terminals may include I/O terminals for the driver IC. In a case being such structured, the electrical circuit element is, for example, an external element for operating the above-mentioned driver IC. As for an external element like this, for example, a surfacemount type capacitor may be used.

When the driver IC is mounted to the electrooptical panel in the present invention, a plurality of electrode patterns extend from an area where the driver IC is located to an image display area of the electrooptical panel. In such an electrooptical unit, in case the I/O terminals for the above-mentioned driver IC are formed as the panel-side terminals, it is possible to provide a space for designing a layout of these I/O terminals and electrode patterns.

In the present invention, a plurality of the first front-side terminals are preferably formed at a wider pitch than that of the panel-side terminals to be connected with the first front-side terminals via the through holes and the first rear-side terminals. In the present invention, since the rear-side terminals of the flexible board are connected directly and electrically with the panel-side terminals of the electrooptical panel, and these rear-side terminals and the panel-side terminals are electrically connected with each other by means of an anisotropic conductive material or the like, even when the panel-side terminals are formed with a narrow pitch, electrical connection can be established. Furthermore, since the first front-side terminals formed at the front side of the flexible board are connected with the connector electrodes of the connector for connecting directly and electrically with the circuit board-side terminals and the panel-side terminals, the first front-side terminals like this can, since being formed at the front side of the flexible board, be formed with a wide pitch in accordance with the pitch of the connector electrodes. Accordingly, as for the panel-side terminals, without being influenced by the pitch of connector electrodes, the panel-side terminals can be formed with a narrow pitch. Consequently, since it is possible to make the area for forming the panel-side terminals smaller in the electrooptical panel, it is possible to make the area which does not contribute directly to the image display smaller. Furthermore, since it is possible to form the electrode patterns in short length, it is possible to reduce the resistance. Furthermore, in the flexible board, since the rear-side terminals and the first front-side terminals are connected with each other via through holes of the flexible board, it is possible to electrically connect the panel-side terminals and the circuit board-side terminals with each other via the flexible board and the connectors. Still further, in the electrooptical panel, the panel-side terminals are often formed from ITO film. Since the ITO film has a larger resistance than that of metals, the resistance value becomes large. Furthermore, in case the film thickness of the ITO is uneven, and when connector electrodes of the rubber connector or the like are compressedly directly connected with the panel-side terminals, in these connection areas, such problems that the initial contact resistance is large, or the contact resistance increases over time likely occur. However, in the present invention, the flexible board is directly connected with the panel-side terminals. Since the flexible board has flexibility, the unevenness of the film thickness of the panel-side terminals can be absorbed. Also, the first surface-side terminals of the flexible board are, generally, gold plated. Accordingly, different from a case where the connector electrodes of the rubber connector or the like are directly electrically connected with the panel-side terminals, such problems that the initial contact resistance is large, or the contact resistance increase over time or the like do not occur.

In the present invention, it is preferable that any of the front-side terminals be formed in an area so as to overlap with at least one of the panel-side terminals flatly. When mounting on the flexible board of the electrooptical panel, the head is applied to the upper face of the flexible board and heated to connect it compressedly. At this time the first front-side terminals come into contact with the head, and under the lower layer side of the first front-side terminals, the rear-side terminals and the panel-side terminals exist. Accordingly, since the first front-side terminals are formed without having any unevenness, the head applies heat and pressure equally to every rear-side terminal and panel-side terminal. Accordingly, the rear-side terminals and the panel-side terminals are electrically connected securely.

In the present invention, the panel-side terminals are formed of, for example, an ITO film. The ITO film can be formed simultaneously with the electrode patterns for driving pixels, when a liquid crystal panel is used as the above-mentioned electrooptical panel.

In the present invention, the above-mentioned electrooptical panel is a liquid crystal panel.

In the present invention, the above-mentioned conductive material is, for example, an anisotropic conductive material.

The electrooptical unit to which the present invention is applied is suitable for use as a display of an electronic apparatus such as mobile phone or the like.

BRIEF DESCRIPTION OF THE DRAWINGS

FIG. 9 is an illustration showing a state in which the flexible board shown in FIG. 8(A) and FIG. 8(B) is overlapped and mounted in an area where terminals of the liquid crystal panel shown in FIG. 7 are formed, in the electrooptical unit of the mobile phone according to the first embodiment of the present invention.

FIG. 10 is an illustration showing a state in which the flexible board shown in FIG. 8(A) and FIG. 8(B) is overlapped and mounted in an area where terminals of the liquid crystal panel are formed, in the electrooptical unit of the mobile phone according to another aspect of the first embodiment of the present invention.

FIG. 13 is an illustration showing a state in which the flexible board shown in FIG. 12(A) and FIG. 12(B) is overlapped and mounted in an area where terminals of the liquid crystal panel shown in FIG. 11 are formed, in the electrooptical unit of the mobile phone according to the second embodiment of the present invention.

FIG. 14 is an illustration showing a state in which the flexible board shown in FIG. 12(A) and FIG. 12(B) is overlapped and mounted in an area where terminals of the liquid crystal panel are formed, in the electrooptical unit of the mobile phone according to another aspect of the second embodiment of the present invention.

DETAILED DESCRIPTION OF THE PREFERRED EMBODIMENTS

Referring to the attached drawings, embodiments of the present invention will be described.

Figure 1:
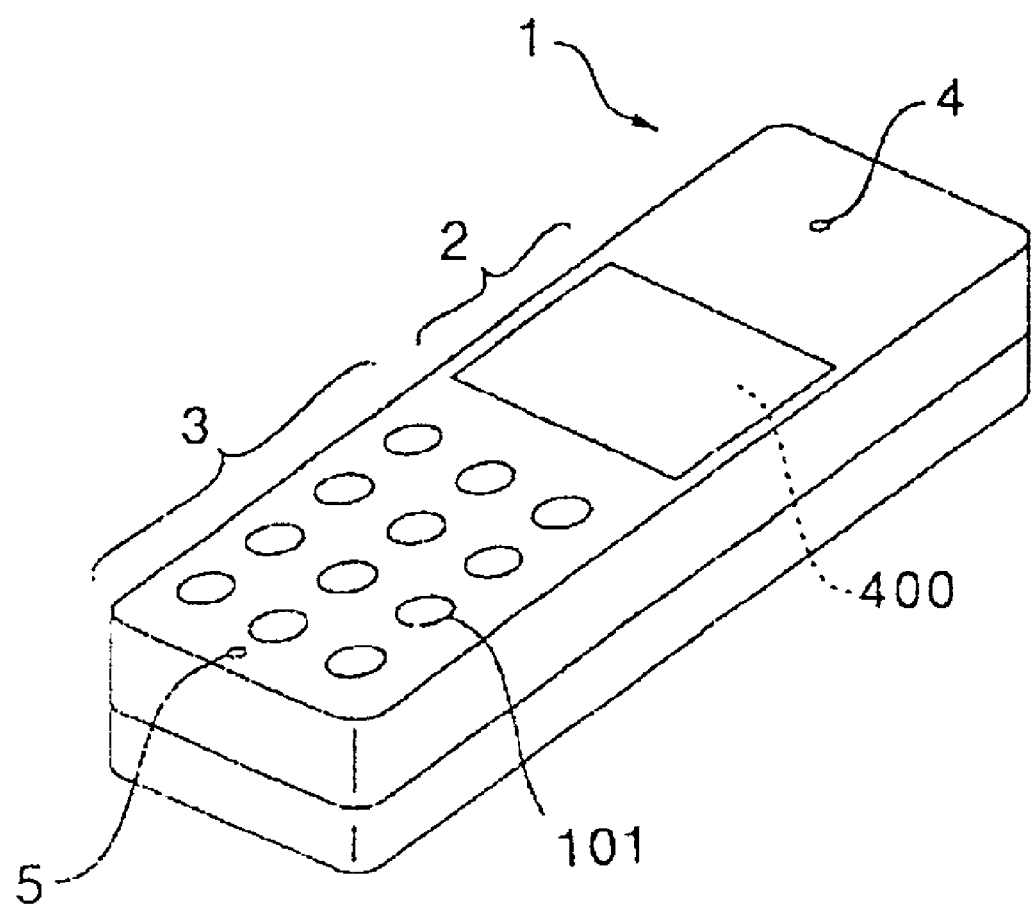
FIG. 1 is a perspective view showing the appearance of a mobile phone as an example of an electronic apparatus to which the present invention is applied.
Figure 2:
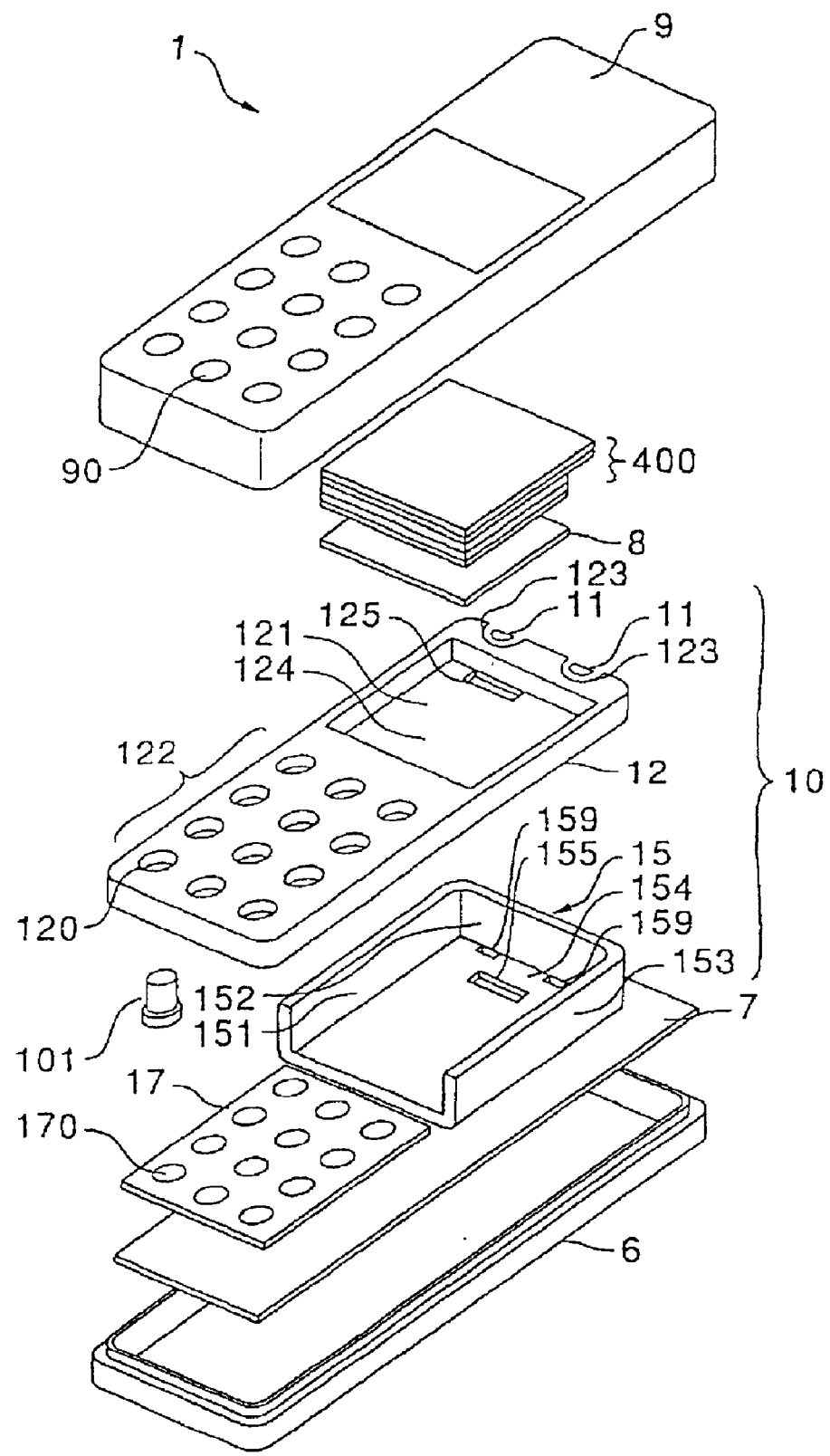
FIG. 2 is an exploded perspective view showing the essential parts of the mobile phone in FIG. 1.
Figure 3:
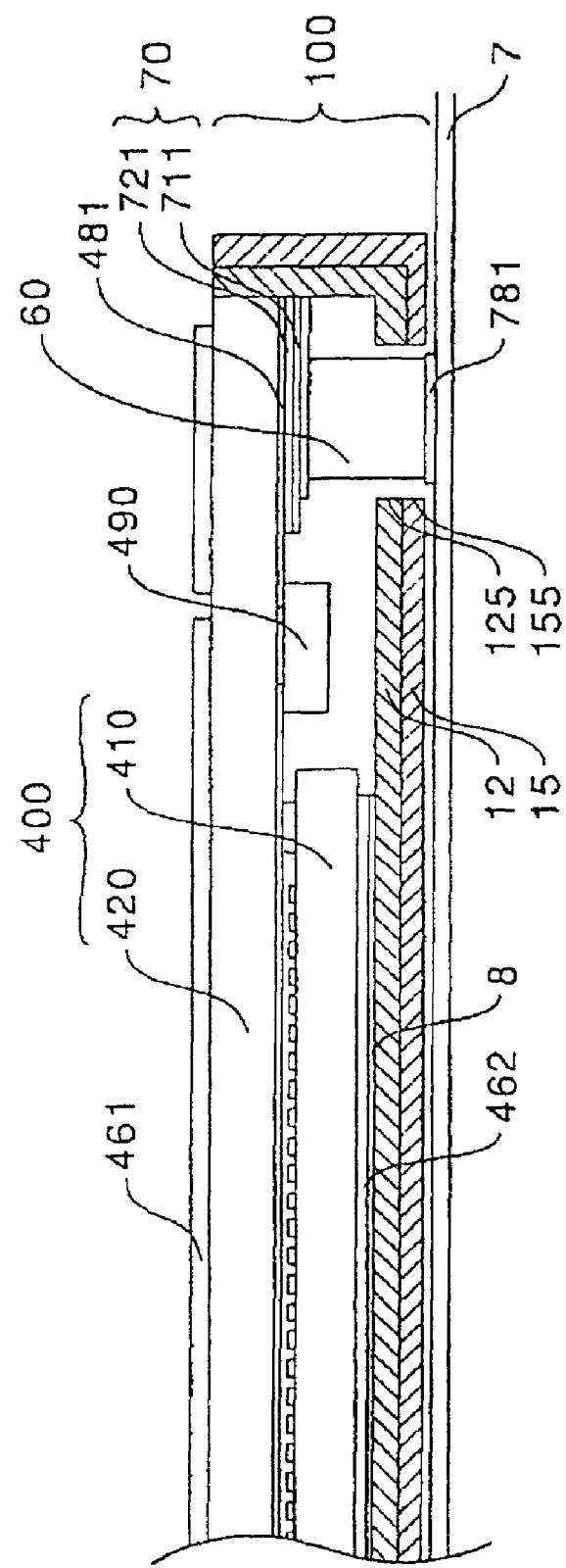
FIG. 3 is an enlarged longitudinal view showing an electrooptical unit of which a circuit board, a first reflecting member, a second reflecting member, a light guide plate, a light diffusing sheet, and a liquid crystal panel are overlapped on top of each other, in the mobile phone according to a first embodiment of the present invention.

FIG. 1 is a perspective view showing the appearance of a mobile phone as an example of an electronic apparatus to which the present invention is applied. FIG. 2 is an exploded perspective view showing an essential part of this mobile phone. FIG. 3 is an enlarged longitudinal sectional view showing a state in which, in the mobile phone an electrooptical unit is constituted by overlapping a circuit board, a first reflecting member, a second reflecting member, a light guide plate, a light diffusing sheet and a liquid crystal panel on top of each other. Further, as the basic structure of the electronic apparatus and the electrooptical unit of this embodiment is identical with that of the conventional electronic apparatus, corresponding portions will be illustrated using the same reference numerals.

In FIG. 1, a mobile phone 1 of this embodiment is comprised of, at the upper part thereof, a display 2 using a liquid crystal panel 400 as an electrooptical panel, and, at the lower part thereof, an operation panel 3 having a plurality of key buttons 101 disposed therein. At the upper portion of the display 2, a speaker aperture 4 is formed, and at a lower portion of the operation panel 3, a microphone aperture 5 is formed.

As shown in FIG. 2, the mobile phone 1 is comprised of a lower case 6, a circuit board 7 having various electrical circuits formed thereon for the mobile phone 1 to function, an illuminating unit 10, a light diffusing sheet 8, a liquid crystal panel 400 for various display as an electrooptical panel and an upper case 9, which are overlapped on top of each other in that order. However, in FIG. 2, the speaker and the microphone are omitted from the illustration.

The illuminating unit 10 is comprised of a light source 11 including an LED or the like, a light guide plate 12 made of a prefabricated transparent plastic member or the like, a first reflecting member 15 made of a prefabricated plastic member or the like, and a sheet-like second reflecting member 17.

In the light guide plate 12 in the illuminating unit 10, an active area 121 is formed as a rectangular concave portion for disposing the liquid crystal panel 400 therein, and in the area adjacent to the active area 121, a keypad area 122 for disposing a plurality of key buttons 101 is provided. In the front edge of the light guide plate 12, concave portions 123 are formed at two positions for disposing the light sources 11 comprising LEDs or the like therein.

In the active area 121 of the light guide plate 12, in the corner of the front edge of a bottom wall 124, a rectangular through hole 125 for electrically connecting the liquid crystal panel 400 with the circuit board 7 is formed.

In the first reflecting member 15, three side wall portions 151, 152 and 153 enclosing the periphery of the rectangular active area 121 in the light guide plate 12 on three sides and a bottom wall portion 154, which is overlapped under the bottom face of the active area 121, are formed. In the bottom wall portion 154 of the first reflecting member 15, a through hole 159 is formed at a position which overlaps with the concave portions 123 of the light guide plate 12. When the first reflecting member 15 and the light guide plate 12 are overlapped with the circuit board 7, the through hole 159 acts as a hole for allowing the light source 11 mounted on the circuit board 7 to pass through to the concave portions 123 in the light guide plate 12.

Further, in the bottom wall portion 154 of the first reflecting member 15, a rectangular through hole 155 is also formed at a position where the through hole 125 of the light guide plate 12 overlaps therewith.

Accordingly, as shown in FIG. 3, at the upper side of the circuit board 7, when an electrooptical unit 100 is assembled by overlapping the first reflecting member 15, the light guide plate 12, the light diffusing sheet 8, and the liquid crystal panel 400 on top of each other, the first reflecting member 15 and the light guide plate 12 interpose between the circuit board 7 and the crystal panel 400, whereas, the circuit board 7 and the liquid crystal panel 400 face each other via the through holes 125 and 155. Accordingly, as will be described below herein-after, by disposing a rubber connector or the like at a position where the circuit board 7 and the liquid crystal panel 400 face each other, the I/O terminals 481 and 781 can be connected with each other.

Furthermore, in FIG. 2, in the operation panel 3 of the upper case 9, the keypad area 122 of the light guide plate 12, and the sheet-like second reflecting member 17, button holes 90, 120 and 170 in which transmitting key buttons 101 are disposed are formed at the positions where they overlap with each other, and the key buttons 101 are disposed in the plurality of button holes 90, 120, 170.

Referring FIG. 4, FIG. 5, and FIG. 6, a description will be made concerning the structure of the liquid crystal panel 400, which is used as the electrooptical panel in the electrooptical unit of the mobile phone 1 according to the first embodiment of the invention.

Figure 4:
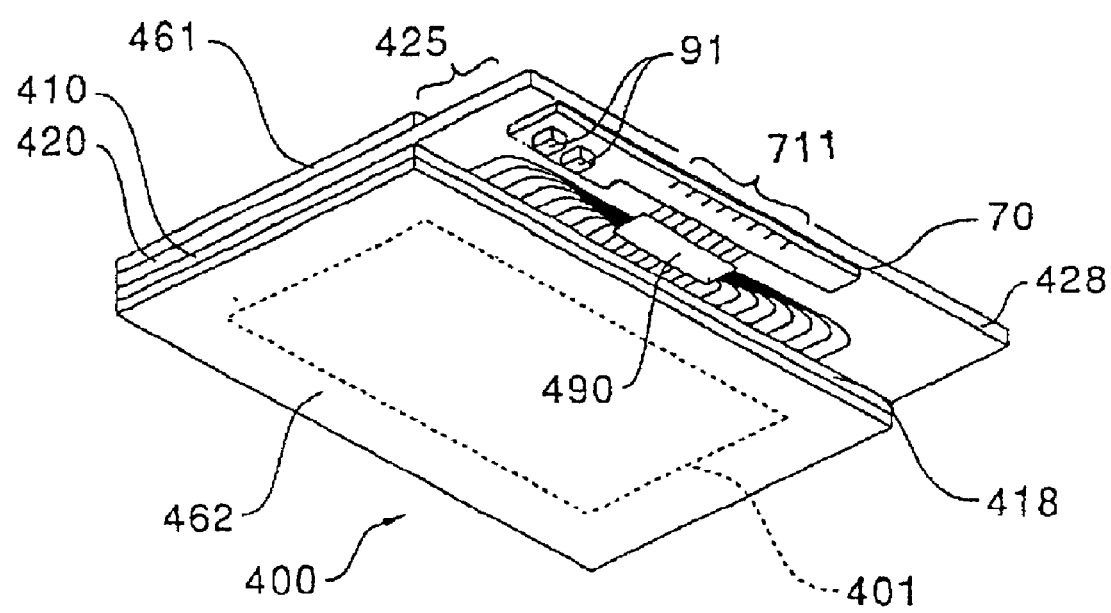
FIG. 4 is a perspective view of the liquid crystal panel, viewed at an angle from the bottom, in the electrooptical unit of the mobile phone according to the first embodiment of the present invention.
Figure 5:
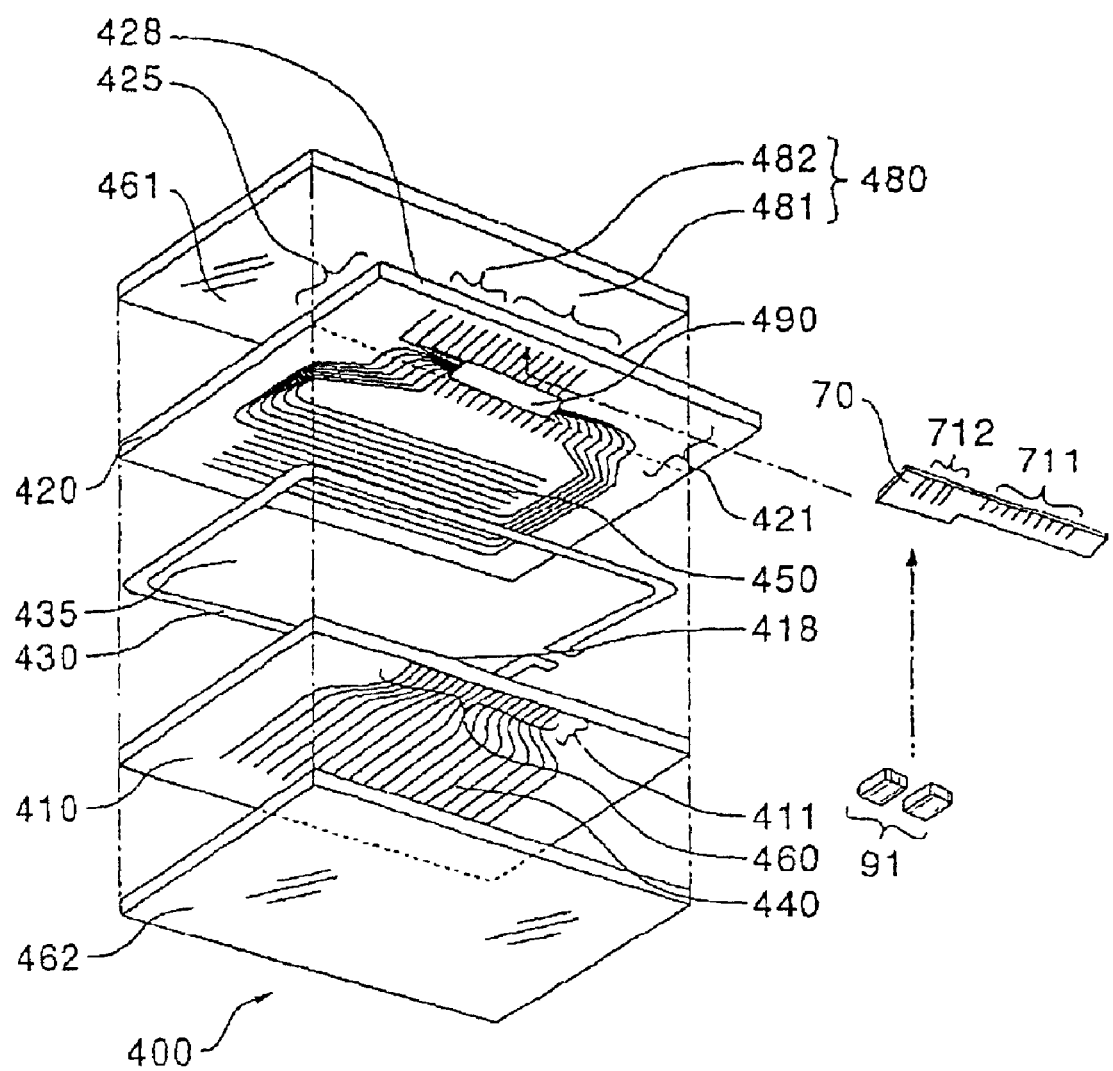
FIG. 5 is an exploded perspective view of the liquid crystal panel, viewed at an angle from the bottom, in the electrooptical unit of the mobile phone according to the first embodiment of the present invention.

FIG. 4 and FIG. 5 are, respectively, a perspective view and an exploded perspective view of the liquid crystal panel 400 viewed at an angle from the bottom. FIG. 6 is an enlarged illustration showing the plane structure of panel-side terminals formed in the liquid crystal panel in the electrooptical unit of the mobile phone according to the embodiment of the invention.

In FIG. 4 and FIG. 5, the liquid crystal panel 400 is a passive matrix type color liquid crystal panel. In the liquid crystal panel 400, a liquid crystal encapsulating area 435 is sealed by a sealing material 430 between a pair of transparent substrates made of rectangular glass and bonded to each other by means of the sealing material 430 being interposed therebetween with a predetermined gap, and liquid crystal is encapsulated within this liquid crystal encapsulating area 435. The liquid crystal encapsulating area 435 constitutes an image display area 401.

Herein, in the above-mentioned pair of transparent substrates, the substrate in which a plurality of lines of first electrode patterns 440 extending in the vertical direction within the liquid crystal encapsulating area 435 is the first transparent substrate 410, whereas, the substrate on which a plurality of lines of second electrode patterns 450 extending in the horizontal direction within the liquid crystal encapsulating area 435 is defined as the second transparent substrate 420.

The liquid crystal panel 400 illustrated herein is a transmissive type, and carries out predetermined display using the illuminating unit 10 shown in FIG. 2 as a backlight. For this purpose, a polarizer 461 is stuck to the external surface of the second transparent substrate 420 and a polarizer 462 is stuck to the external surface of the first transparent substrate 410. Furthermore, although not shown in the figures, in the second transparent substrate 420, at the areas corresponding to the areas where the first electrode patterns 440 cross the second electrode patterns 450, red (R), green (G), and blue (B) color filters are formed; on the top of the color filters, an insulative planer film, the second electrode patterns 450, and an alignment film are formed in that order. In the first transparent substrate 410, the first electrode patterns 440 and alignment film are formed in that order. In the liquid crystal panel 400, both the first electrode patterns 440 and the second electrode patterns 450 are formed of an ITO film.

In the liquid crystal panel 400, when inputting or outputting signals from/to the external devices and establishing conductivity among the substrates, a first area formed with terminals 411 and a second area formed with terminals 421, which are formed on the first transparent substrate 410 and the second transparent substrate 420, respectively, in an area adjacent to respective substrate edges 418 and 428, positioned in the same direction, of the first transparent substrate 410 and the second transparent substrate 420, are used. For the second transparent substrate 420, a substrate larger than the first transparent substrate 410 is used, and a driver IC 490 is COG-mounted in the area 425 of the second transparent substrate 420 extending past the substrate edge 418 of the first transparent substrate 410 when the first transparent substrate 410 and the second transparent substrate 420 are bonded together. Accordingly, in the second transparent substrate 420, many patterns, such as second electrode patterns 450 or the like, extend from the area having the driver IC 490 mounted thereon, toward the image display area 401.

Herein, since the area positioned at the side of the liquid crystal encapsulating area 435 relative to the driver IC 490 is used for establishing conductivity with the substrates at the first transparent substrate 410 side, the second area formed with terminals 421 is formed in the area which overlaps with the first transparent substrate 410. Since the first area formed with terminals 411 is used for establishing conductivity with the substrates at the second transparent substrate 420 side, in the first transparent substrate 410 the first area formed with terminals 411 is formed in the area overlapped with the second transparent substrate 420.

Figure 6:
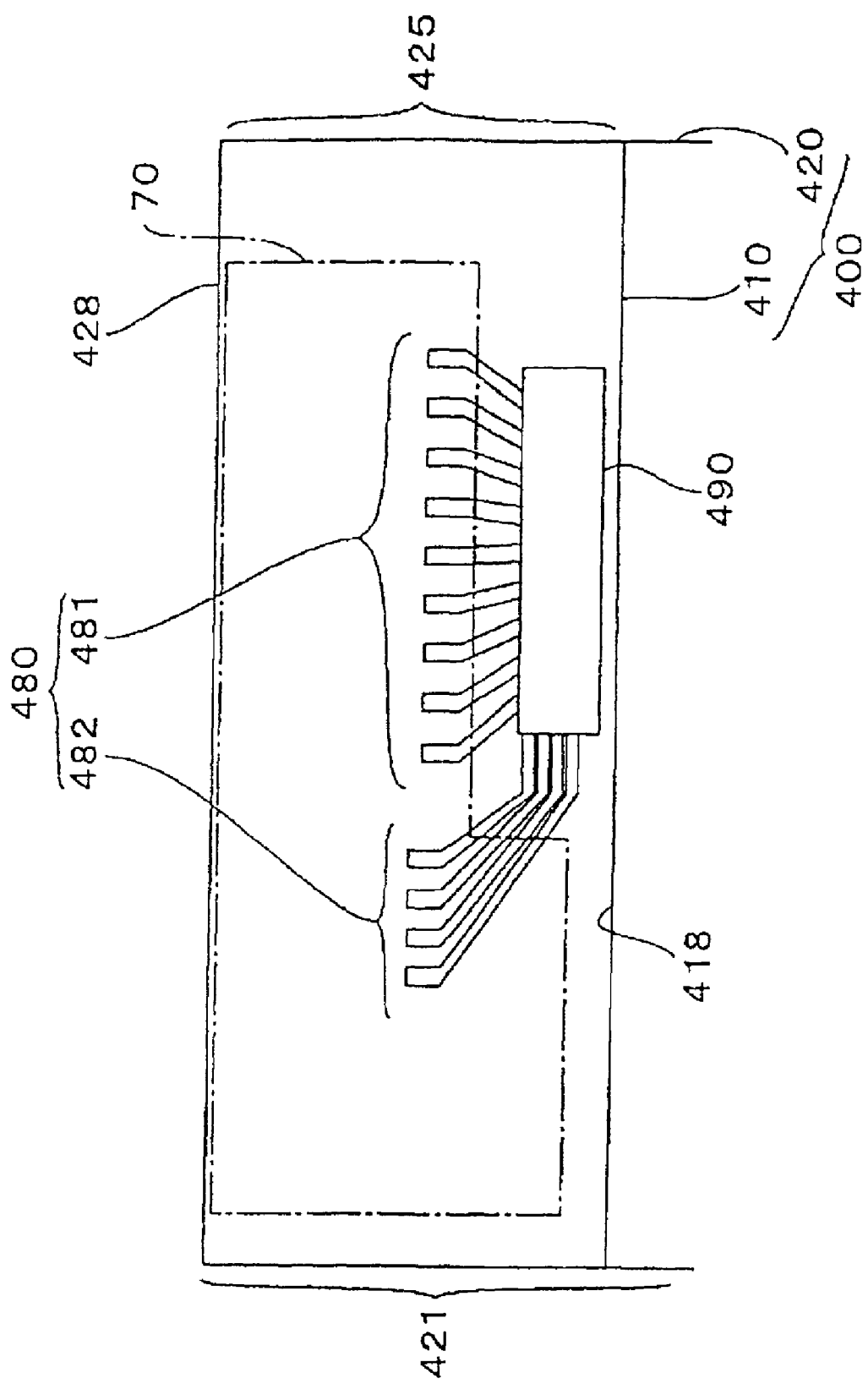
FIG. 6 is an enlarged illustration showing the planar structure of panel-side terminals formed in the liquid crystal panel in the electrooptical unit of the mobile phone according to the first embodiment of the present invention.

As shown in enlarged form in FIG. 6, in the second area formed with terminals 421 of the second transparent substrate 420, in the area positioned toward the side of a board edge 428 relative to the driver IC 490, a plurality of panel-side terminals 480 are formed in line along the board edge 428. The panel-side terminals 480 are comprised of the I/O terminals 481 for the driver IC 490 and terminals 482 to which the electrodes of the surface mount type capacitors 91 for boosting the voltage externally mounted on the driver IC 490 are electrically connected.

The first transparent substrate 410 and the second transparent substrate 420 which are structured as described above, as shown in FIG. 4 and FIG. 5, are bonded to each other by means of the sealing material 430 containing a conductive material to establish conductivity between the substrates. In this state, when signals are inputted from the substrate edge 481 of the second transparent substrate 420 to the driver IC 490, the signals outputted from the driver IC 490 are supplied to the first electrode patterns 440 and the second electrode patterns 450. Accordingly, individual pixels positioned at the intersection points where the first electrode patterns 440 and second electrode patterns 450 cross each other are driven.

In the liquid crystal panel 400 structured as described above, any of the panel-side terminals 480 I/O terminals 481 and terminals 482) are formed of an ITO film, which is formed at the same time as the second electrode patterns 450. Furthermore, the inter-substrate conducting terminals formed in the first transparent substrate 410 and the second transparent substrate 420 are also formed of ITO film, which is formed at the same time as the first electrode patterns 440 and the second electrode patterns 450.

In this embodiment, when the circuit substrate-side terminals 781 and the capacitors 91 are electrically connected with the panel-side terminals 480 (I/O terminals 481 and terminals 482) of the liquid crystal panel 400 which is structured as described above, a flexible board as shown in FIG. 7(A), FIG. 7(B), FIG. 8(A), FIG. 8(B), and FIG. 9 is used.

Figure 7:
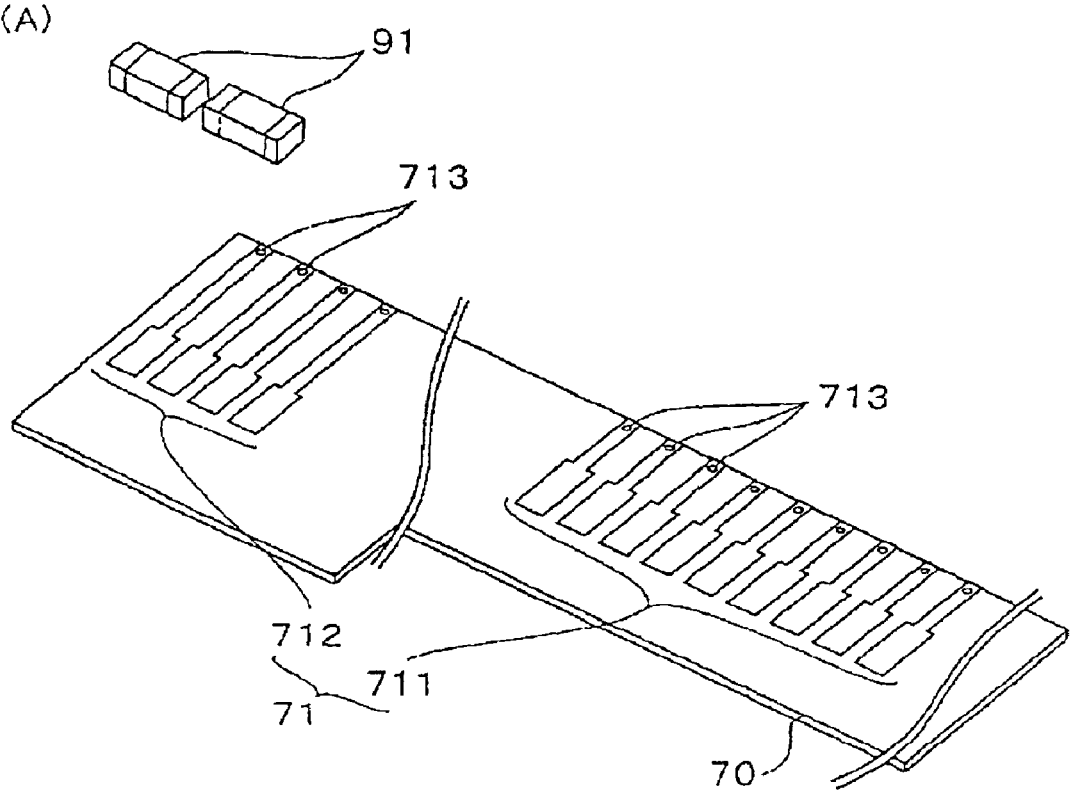
FIG. 7(A) and FIG. 7(B) are a perspective view of a flexible board used in the electrooptical unit viewed at an angle from the front side and a perspective view of the flexible board viewed at an angle from the rear side, respectively, in the electrooptical unit of the mobile phone according to the first embodiment of the present invention.
Figure 7:
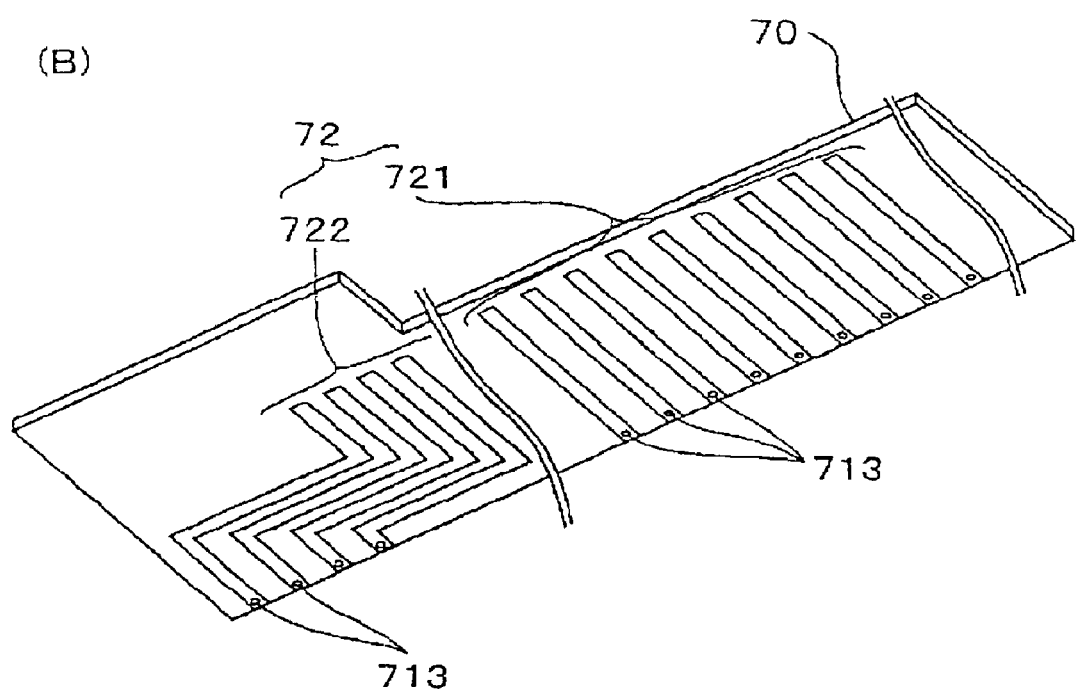
Figure 8:
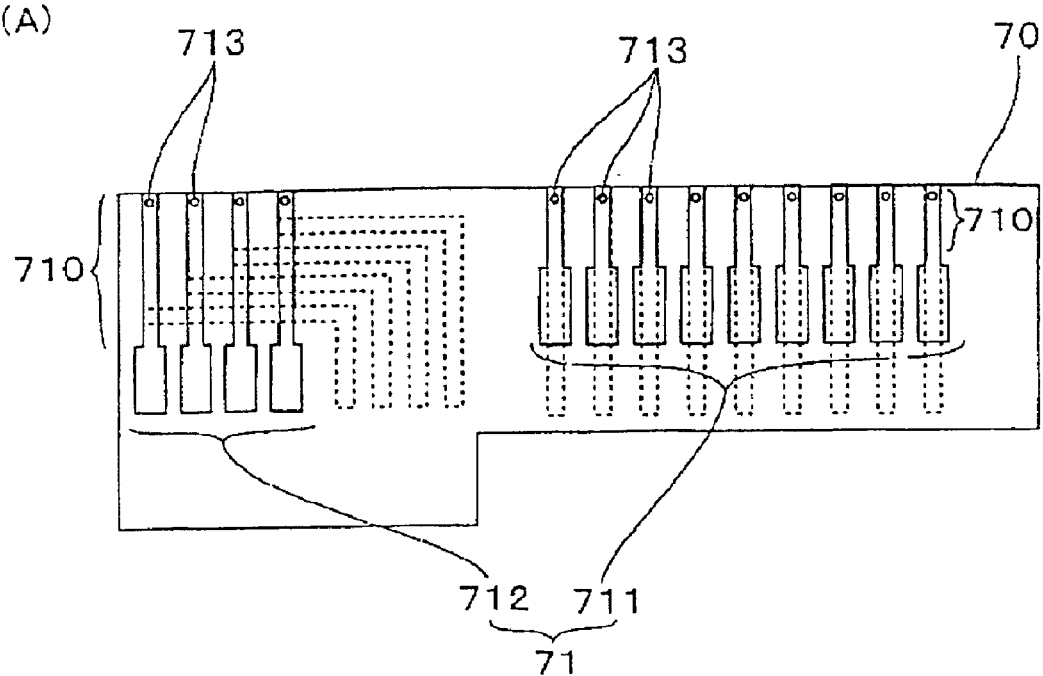
FIG. 8(A) is an illustration showing front-side terminals and front-side wiring patterns formed at the front side of the flexible board being overlapped with a liquid crystal panel, represented by solid lines, and showing rear-side terminals and rear-side wiring patterns formed at the rear side of the flexible board, represented by broken lines, in the electrooptical unit of the mobile phone according to the first embodiment of the present invention.
FIG. 8(B) is an illustration showing rear-side terminals and rear-side wiring patterns formed at the rear side of the flexible board, represented by solid lines, and showing front-side terminals and front-side wiring patterns formed at the front side of the flexible board, represented by broken lines.
Figure 8:
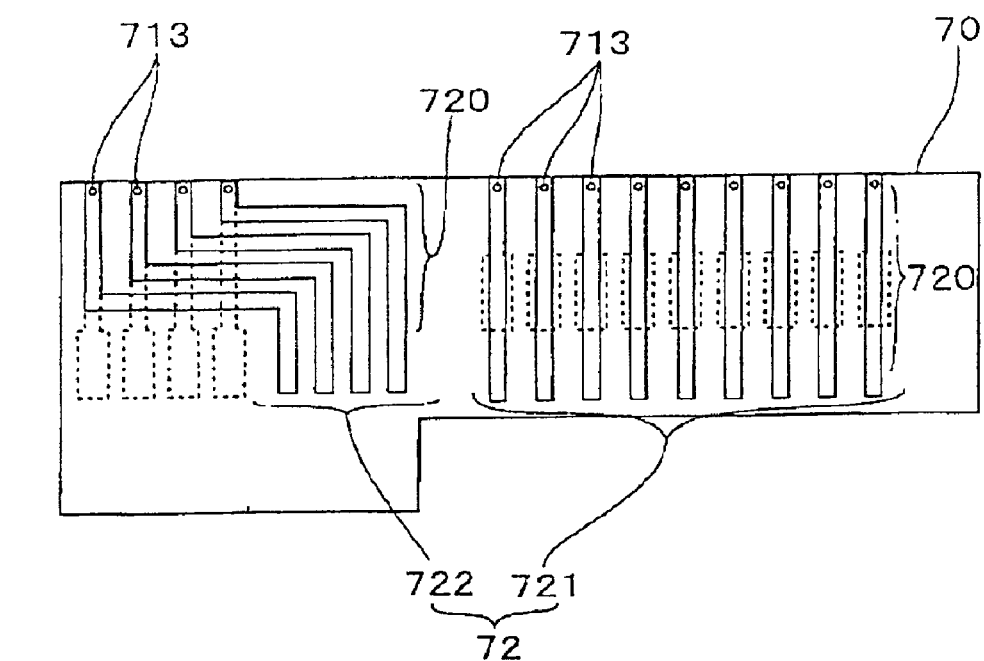
Figure 9:
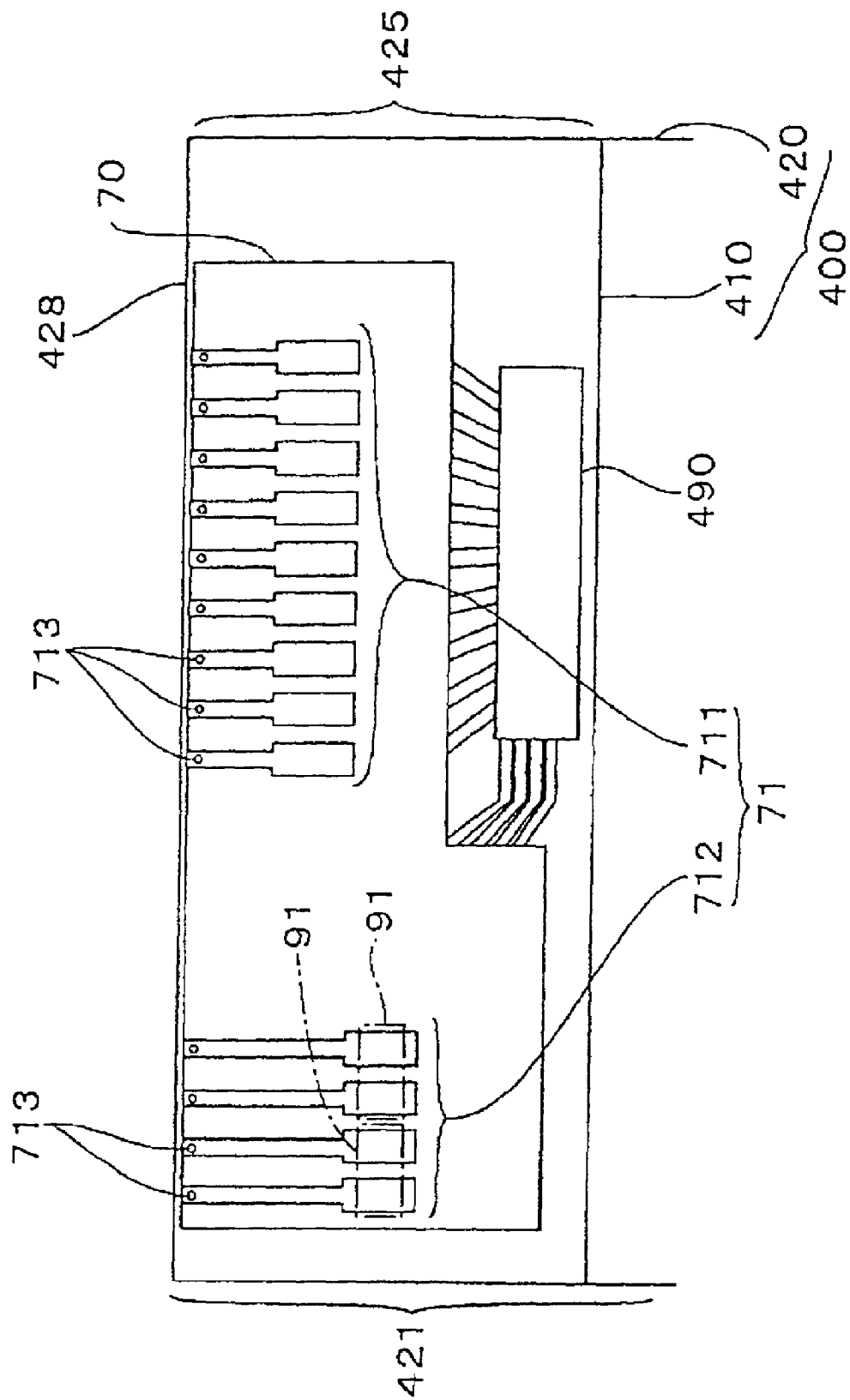

FIG. 7(A) and FIG. 7(B) are a perspective view of a flexible board 70 used in this embodiment viewed at an angle from the front side, and a perspective view of the flexible board 70 viewed at an angle from the rear side, respectively. FIG. 8(A) is an illustration showing front-side terminals and wiring patterns, which are formed on the front side of the flexible board 70 used in this embodiment, and are represented by solid lines, and showing rear-side terminals and rear-side wiring patterns, which are formed on the rear side of the flexible board 70, represented by the broken lines. FIG. 8(B) is an illustration showing rear-side terminals and wiring patterns, which are formed on the rear side of the circuit board 70, represented by solid lines, and showing front-side terminals and front-side wiring patterns, which are formed on the front side of the flexible board 70, represented by broken lines. FIG. 9 is an illustration showing a state in which the flexible board shown in FIG. 7(A), FIG. 7(B), FIG. 8(A), and FIG. 8(B) is overlapped with and mounted in an area formed with terminals shown in FIG. 6.

In FIG. 7(A), FIG. 7(B), FIG. 8(A) and FIG. 8(B), at the front side of the flexible board 70 used in this embodiment, a plurality of front-side terminals 71 and a plurality of front-side wiring patterns 710 extending toward the edge of the flexible board 70 from each of the front-side terminals 71 are formed. Whereas, at the rear side of the flexible board 70, a plurality of rear-side terminals 72 and a plurality of rear-side wiring patterns 720 extending toward the edge of the flexible board 70 from each of the rear-side terminals 72 are formed. Herein, the edges of the front-side wiring patterns 710 and the rear-side wiring patterns 720 are overlapped with each other flatly, and through holes 713 are formed in this overlapping area. Because of this, the front-side terminals 71 and the rear-side wiring patterns 72 are electrically connected via the through holes 713.

In this embodiment, as illustrated in FIG. 6 and FIG. 8(B), when the flexible board 70 is overlapped with an extending portion 425 of a second transparent board 420, first rear-side terminals 721 which overlap with I/O terminals 481 and second rear-side terminals 722 which overlap panel-side terminals 482 to be electrically connected with the capacitors 91 are included in the plurality of rear-side terminals 72.

Further, as illustrated in FIG. 8(A) and FIG. 8(B), first front-side terminals 711 (terminals for connecting with the connector) which are electrically connected with the first rear-side terminals 721 via the through holes 713 and second front-side terminals 712 (terminals for capacitor mount) which are electrically connected with the second rear-side terminals 722 via the through holes 713 are included in the front-side terminals 71.

Herein, the surfaces of the front-side terminals 71 (first front-side terminals 711 and second front-side terminals 712) and the rear-side terminals 72 (first rear-side terminals 721 and second rear-side terminals 722) are gold plated.

In this embodiment, by using the flexible board 70 structured as described above, in a manner which will be described hereinafter, electrodes of the capacitors 91 are electrically connected with panel-side terminals 482 of the liquid crystal panel 400, and the circuit board-side terminals 781 of the circuit board 7 are connected with the I/O terminals 481 of the liquid crystal panel 400 (refer to FIG. 3). Furthermore, the surfaces of the I/O terminals 781 of the circuit board 7 are also gold plated.

First of all, as shown in FIG. 9, the capacitors 91 are mounted on the surface of the second front-side terminals 712 of the flexible board 70 by means of soldering.

Then, the flexible board 70 having the capacitors 91 mounted on the surface thereof is mounted using an anisotropic conductive material so that the rear side thereof faces the liquid crystal panel 400 (second transparent substrate 420) and overlaps the extending area 425 of the second transparent substrate 420. As a result, the flexible board 70 is mounted on the second transparent substrate 420 so that they overlap with each other. In this state, the entire flexible board 70 overlaps the second transparent substrate 420 including the area where the through holes 713 are formed, and does not extend past the substrate edge 428.

Furthermore, between the rear side of the flexible board 70 and the liquid crystal panel 400, the first rear-side terminals 721 are electrically connected with the I/O terminals 481 of the liquid crystal panel 400 by means of an anisotropic conductive material and the second rear-side terminals 722 are electrically connected with the terminals 482 of the liquid crystal panel 400 by means of an anisotropic conductive material.

Then, as shown in FIG. 3, on the upper side of the circuit board 7, the electrooptical unit 100 is assembled by overlapping the first reflecting member 15, the light guide plate 12, and the liquid crystal panel 400 on top of each other. At this time, a rubber connector 60 is disposed between the flexible board 70 and the circuit board 7.

As a result, the connector electrodes of the rubber connector 60 are pressed into contact with the first front-side terminals 711 of the flexible board 70, by the elasticity, and at the same time, are also pressed into contact with the I/O terminals 781 of the circuit board 7 by the elasticity. Accordingly, the I/O terminals 481 of the liquid crystal panel 400 and the I/O terminals 781 of the circuit board 7 are electrically connected via the first rear-side terminals 721 of the flexible board 70, the through holes 713, the first front-side terminals 711, and the connector electrodes of the rubber connector 60.

Furthermore, the capacitors 91 are electrically connected with the driver IC 490 via the second front-side terminals 712 of the flexible board 70, the through holes 713, the second rear-side terminals 721, and the terminals 482.

As described above, in this embodiment, the rear-side terminals 72 of the flexible board 70 are directly electrically connected with the panel-side terminals 480 (terminals 481 and 482) of the liquid crystal panel 400, and, electronic components such as the capacitors 91 and the rubber connector 60 are electrically connected to the front-side terminals 71 of the flexible board 70. Herein, as the flexible board 70 has flexibility, unevenness of thickness of the ITO film which constitutes the terminals 481 and 482 of the liquid crystal panel 400 can be absorbed, and, as the rear-side terminals 72 of the flexible board 70 are gold plated, different from a case in which the surface mount type capacitors 91 and the rubber connector 60 are directly electrically connected with the terminals 481 and 482 of the liquid crystal panel 400, problems such as the initial contact resistance being large or the contact resistance increasing over time do not occur.

That is to say, the surface mount type capacitors 91 are not directly electrically connected with the panel-side terminals 482 of the liquid crystal panel 400 by means of an anisotropic conductive material, but are electrically connected with the second front-side terminals 712 of the flexible board 70 by means of soldering, and these second front-side terminals 712 are electrically connected with the panel-side terminals 482 of the liquid crystal panel 400 satisfactorily. Accordingly, in the electrical connection in these areas, the contact resistance is small, and resistance changes over time do not occur.

Further, the rubber connector 60 is not compressedly connected directly with the I/O terminals 481 of the liquid crystal panel 400, but is compressedly connected with the front-side terminals 71 of the flexible board 70; and these first-side terminals 711 are suitably connected with the I/O terminals 481 of the liquid crystal panel 400. Herein, although the structure is such that, with the first front-side terminals 711 of the flexible board 70, the connector electrodes of the rubber connector 60 are pressed into contact only by the elasticity, as the front-side terminals 71 of the rubber connector 60 are gold plated, in these areas where they are electrically connected, the contact resistance is small only by being compressedly connected, and resistance changes over time will hardly occur. Also, although the connector electrodes of the rubber connector 60 are structured so as to be compressedly connected with the I/O terminals 781 of the circuit board 7 by the elasticity, as the I/O terminals 781 are also gold plated, in these areas where they are electrically connected, the contact resistance is small just by being compressedly connected, and resistance changes over time will hardly occur. Accordingly, when a display is made by using the liquid crystal panel 400, problems such as the panel not illuminating or illuminating dimly due to an increase in resistance at the electrically connected areas are eliminated.

Figure 10:
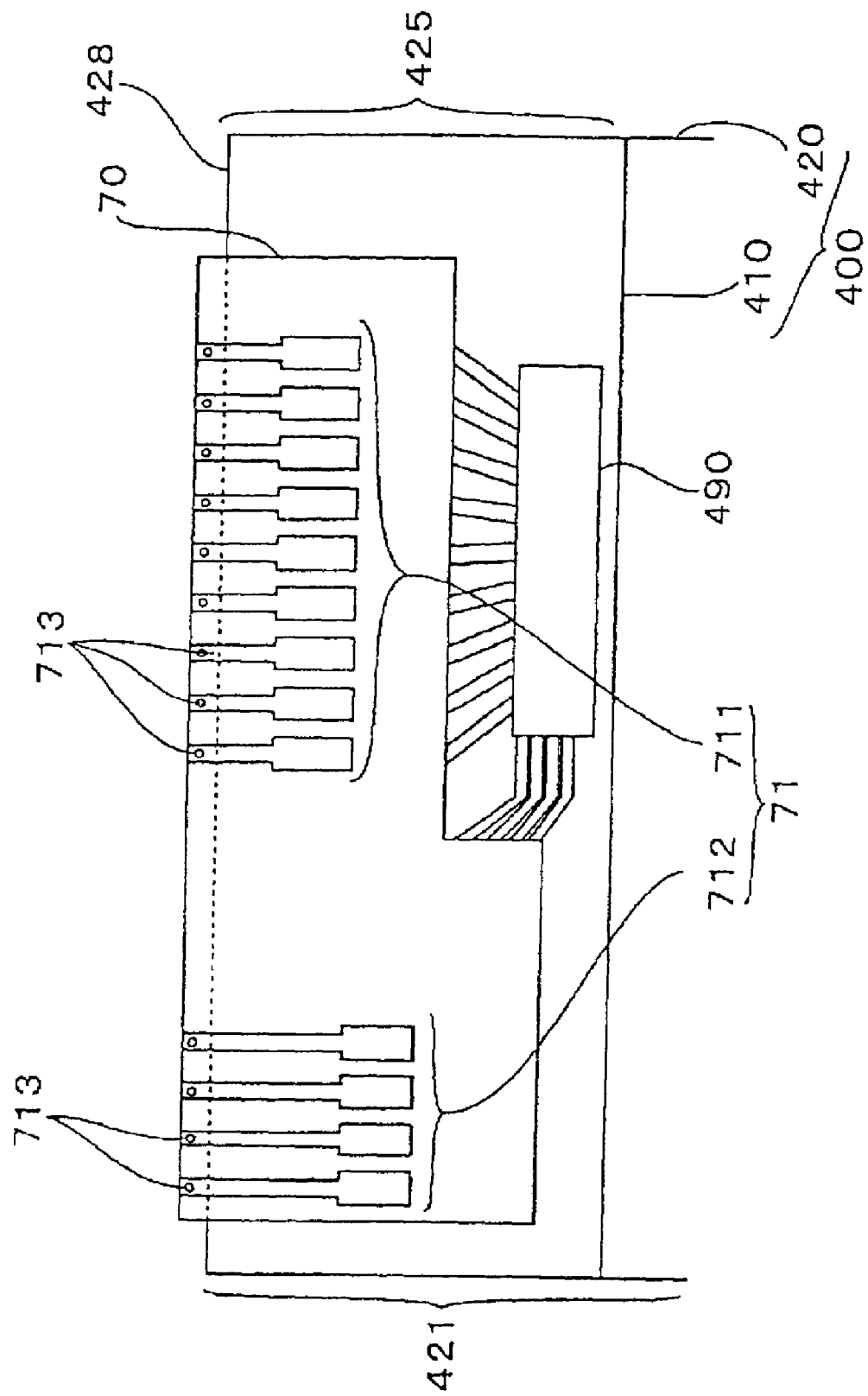

In the first embodiment described above, as the entire flexible board 70 overlaps the liquid crystal panel 400 including the edge area where the through holes 713 are formed, the electrooptical unit 100 is made compact. Whereas, in this embodiment, as shown in FIG. 10, the area where the through holes 713 are formed in the flexible board 70 extends past the edge of the liquid crystal panel 400 (I/O terminals 428 of the second transparent substrate 420). As other structures are the same as those of the first embodiment, the common portions are given identical reference numerals and their description will be omitted.

By being structured as described above, the area where the edge of the flexible board 70 extends past the edge of the liquid crystal panel 400 provides a larger area where the wiring patterns are laid at the rear side and the front side of the flexible board 70. Accordingly, when designing the flexible board 70, an advantage of higher design freedom is obtained.

Figure 11:
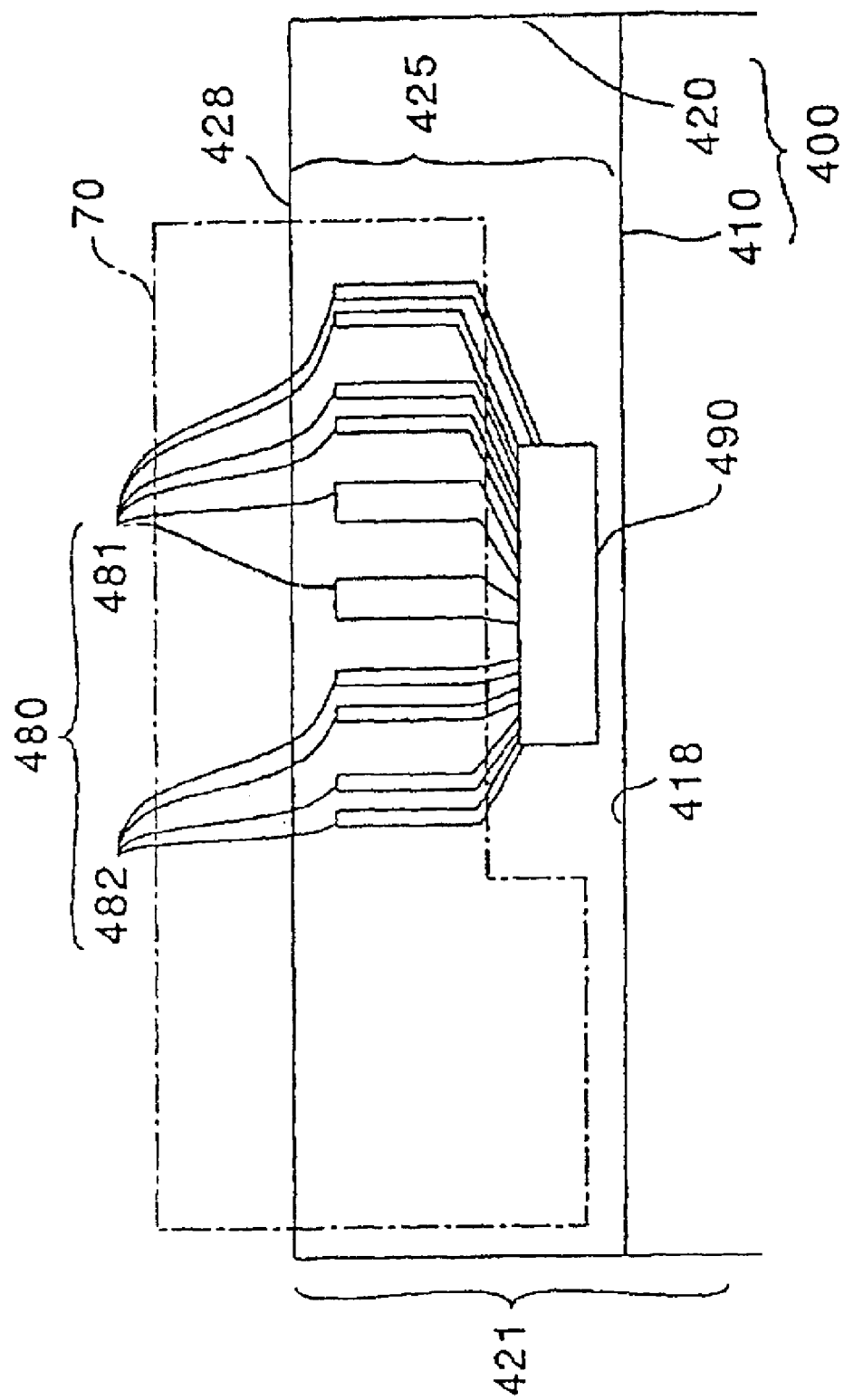
FIG. 11 is an enlarged illustration showing the planar structure of panel-side terminals formed in the liquid crystal panel, in the electrooptical unit of the mobile phone according to a second embodiment of the present invention.
Figure 12:
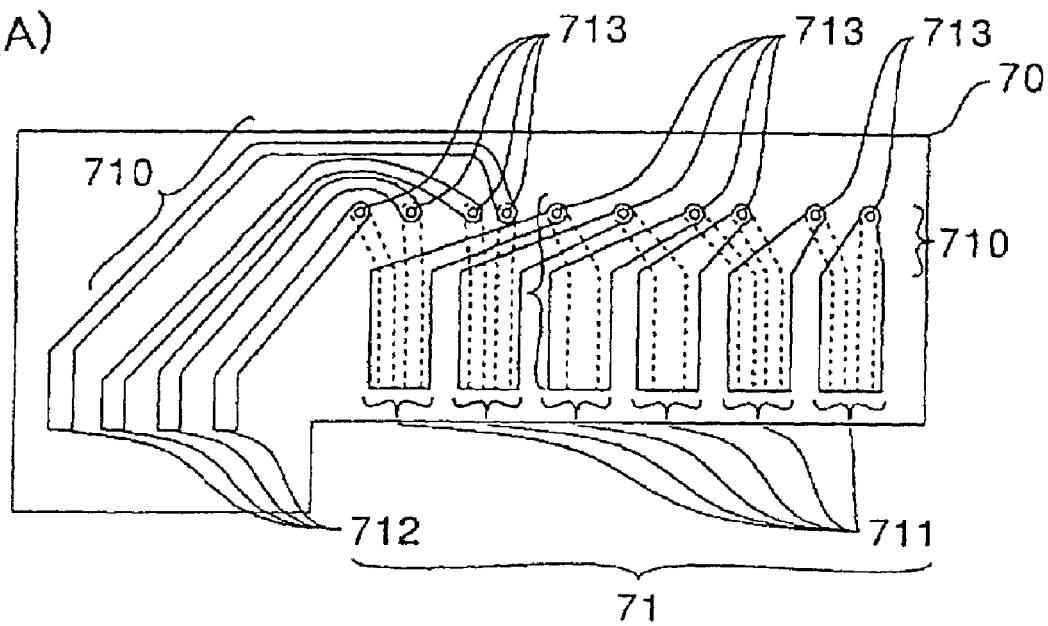
FIG. 12(A) is an illustration showing front-side terminals and front-side wiring patterns formed at the front side of the flexible board being overlapped with a liquid crystal panel, represented by solid lines, and showing rear-side terminals and rear-side wiring patterns formed at the rear side of the flexible board, represented by broken lines, in the electrooptical unit of the mobile phone according to the second embodiment of the present invention.
FIG. 12(B) is an illustration showing rear-side terminals and rear-side wiring patterns formed at the rear side of the flexible board, represented by solid lines, and showing front-side terminals and front-side wiring patterns formed at the front side of the flexible board, represented by broken lines.
Figure 12:
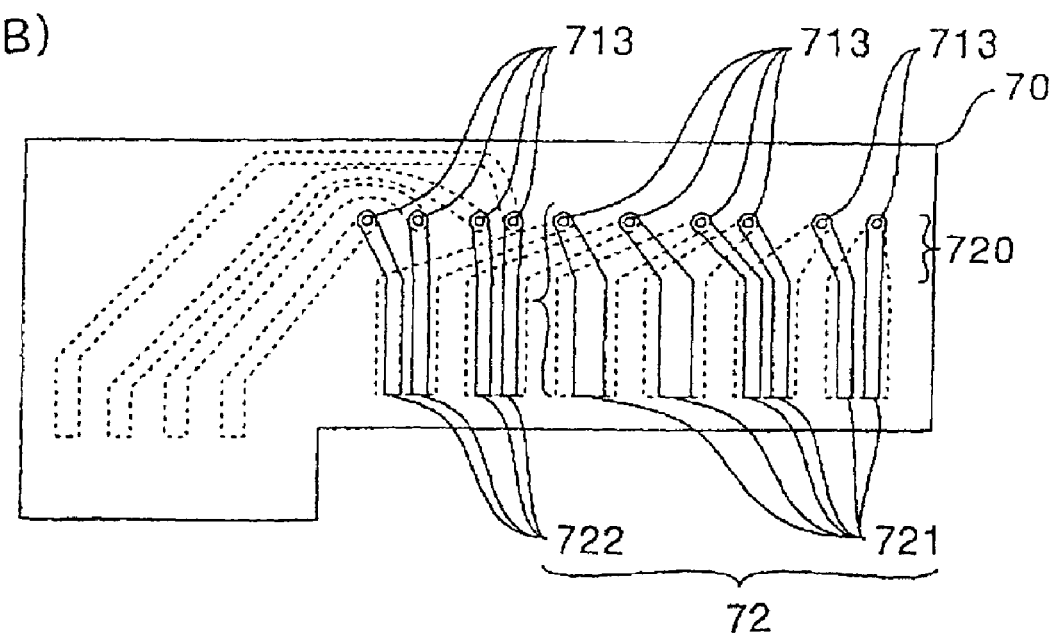
Figure 13:
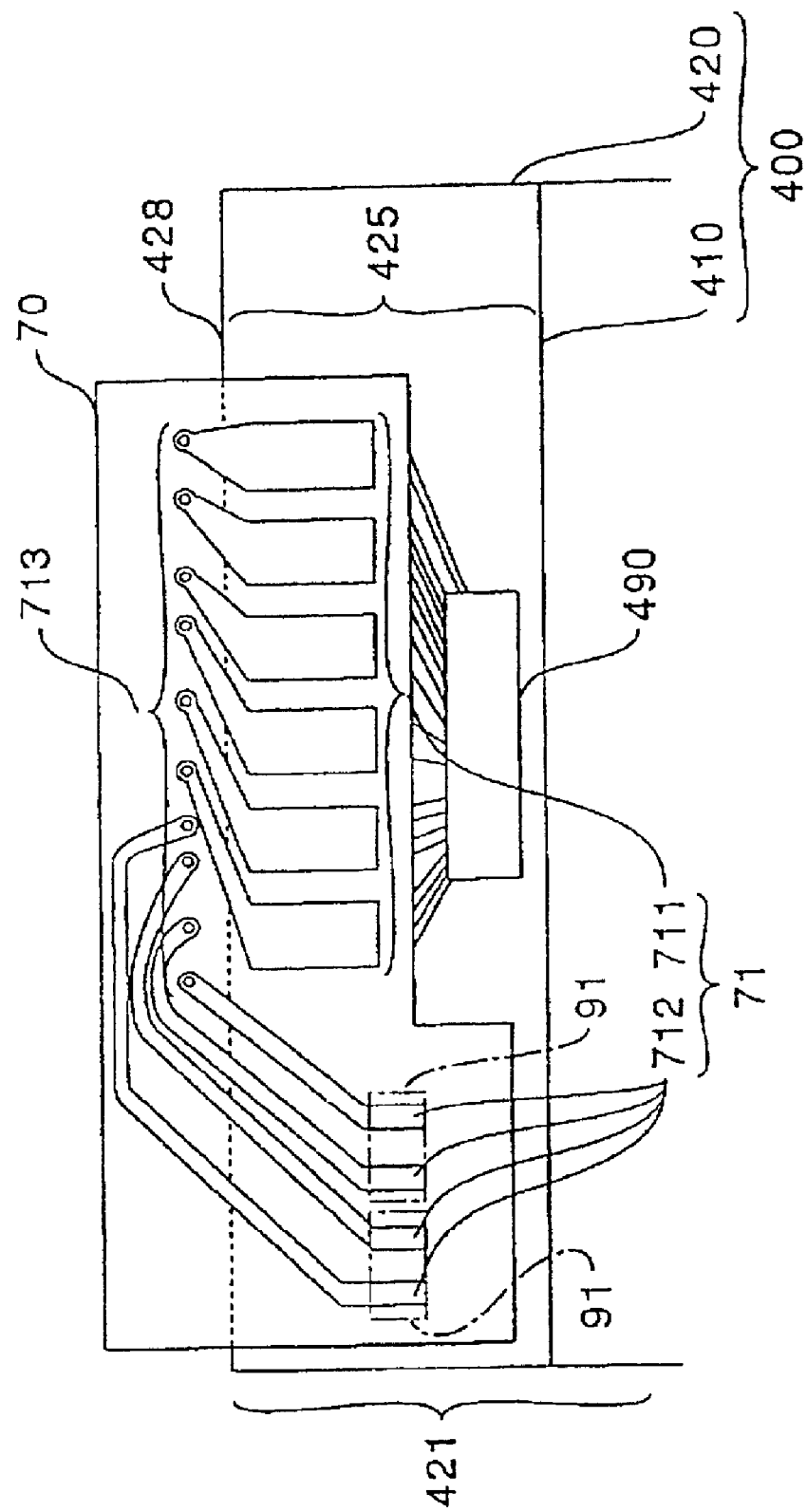

FIG. 11 is an enlarged illustration showing, in the electrooptical unit of the mobile phone (electronic apparatus) according to a second embodiment of the present invention, the planar structure of panel-side terminals formed in the liquid crystal panel. FIG. 12(A) is an illustration showing, in the electrooptical unit, front-side terminals and front-side wiring patterns which are formed at the front side of the flexible board overlapped with the liquid crystal panel and which are represented by solid lines, and showing rear-side terminals and rear-side wiring terminals which are formed at the rear side of the flexible board and which are represented by the broken lines. FIG. 12(B) is an illustration showing rear-side terminals and rear-side wiring patterns which are formed at the rear side of the flexible board and which are represented by solid lines, and showing front-side terminals and front-side wiring patterns which are formed at the front side of the flexible board and which are represented by broken lines. FIG. 13 is an illustration showing a state in the electrooptical unit, in which the flexible board shown in FIG. 12(A) and FIG. 12(B) is overlapped and mounted in an area having terminals formed thereon of the liquid crystal panel shown in FIG. 11.

Furthermore, as the basic structure of the mobile phone, the electrooptical unit and the liquid crystal panel are the same as those described in the description of the first embodiment, the corresponding portions are given the same reference numerals and descriptions thereof will be omitted.

In this embodiment also, as described with reference to FIG. 4 and FIG. 5, in a liquid crystal panel 400, when carrying out inputting and outputting of signals to/from external devices, or when establishing conductivity between the boards, a first area formed with terminals 411 and a second area formed with terminals 421, which are formed in a first transparent substrate 410 and a second transparent substrate 420, respectively, in the area adjacent to each substrate edge 418 and 428 positioned in the same direction of the first transparent substrate 410 and the second transparent substrate 420, are used. As for the second transparent substrate 420, a substrate larger than the first transparent substrate 410 is used, and a driver IC 490 is COG-mounted in the area 425, where the second transparent substrate 420 extends past the substrate edge 418 of the first transparent substrate 410 when the first transparent substrate 410 and the second transparent substrate 420 are bonded together, and a plurality of electrode patterns extend from the area where the driver IC 490 is mounted toward an image display area 401.

Herein, since the area positioned at the side of a liquid crystal encapsulating area 435 relative to the driver IC 490 is used for establishing conductivity with the first transparent substrate 410, the second area formed with terminals 421 is formed in the area where it overlaps with the first transparent substrate 410. Also, in the first transparent substrate 410, the first area formed with terminals 411 is, since the area is used for establishing conductivity with the second transparent substrate 420, formed in the area where it overlaps with the second transparent substrate 420.

Whereas, as shown in enlarged form in FIG. 11, in the second area formed with terminals 421 of the second transparent substrate 420, in the area positioned at the side of a substrate edge 428 relative to the driver IC 490, a plurality of panel-side terminals 480 are formed in line along the board edge 428. These panel-side terminals 480 are comprised of I/O terminals 481 for the driver IC 490 and the panel-side terminals 482 which are electrically connected with the electrodes of the surface mount type capacitors 91 for boosting which are mounted external to the driver IC 490.

In the liquid crystal panel 400 structured as described above, both of the panel-side terminals 480 (I/O terminals 481 and terminals 482) are formed of ITO film, which is formed at the same time as the second electrode patterns 450 (refer to FIG. 5).

In this embodiment, when electrically connecting the circuit board-side terminals 781 and the capacitors 91 to the panel-side terminals 480 (I/O terminals 481 and terminals 482) of the liquid crystal panel 400 structured as described above, a flexible board 70 shown in FIG. 12(A) and FIG. 12(B) is used.

In FIG. 12(A) and FIG. 12(B), at the front side of the flexible board 70 used in this embodiment, the plurality of front-side terminals 71 and the front-side wiring patterns 710 extending from each of the front-side terminals 71 toward the edge of the flexible board 70 are formed. Whereas, at the rear side of the flexible board 70, the plurality of rear-side terminals 72 and the rear-side wiring patterns 720 extending from each of the rear-side terminals 72 toward the edge of the flexible board 70 are formed. Herein, the edge of the front-side wiring patterns 710 and the rear-side wiring patterns 720 overlap flatly with each other at the respective edges; and the through holes 713 are formed in the overlapping area. Accordingly, the front-side terminals 71 and the rear-side terminals 72 are electrically connected via the through holes 713.

In the present invention, in the rear-side terminals 72, as illustrated in FIG. 11 and FIG. 12(B), when the flexible board 70 is overlapped with the extending area 725 of the second transparent substrate 20, the first rear-side terminals 721 which overlap with the I/O terminals 481, and the second rear-side terminals 722 which overlap with the terminals 482 to be connected electrically with electrodes of the capacitor 91 are included.

Further, as illustrated in FIG. 12(A) and FIG. 12(B), in the front-side terminals 71, first front-side terminals 711 (terminals for connector connection) which are electrically connected with the first rear-side terminals 721 via the through holes 713, and second front-side terminals 712 (terminals for capacitor mounting) which are electrically connected with the second rear-side terminals 722 via the through holes 713 are included.

Herein, the surface of the front-side terminals 71 (first front-side terminals 711 and second front-side terminals 712) and the rear-side terminals 72 (first rear-side terminals 721 and second rear-side terminals 722) are gold plated.

In this embodiment, as illustrated in FIG. 11, FIG. 12(A), FIG. 12(B), on the second transparent substrate 420 of the liquid crystal panel 400, the panel-side terminals 480 (I/O terminals 481 and terminals 482) are formed with a considerably narrow pitch. Also, since the rear-side terminals 72 are directly and electrically connected with the panel-side terminals 480 (I/O terminals 481 and terminals 482) which overlap therewith, the flexible board 70 is formed with a considerably low pitch as like the panel-side terminals 480.

Compared to this, although the number of the first front-side terminals 711 is smaller than that of the I/O terminals 481 and the panel-side terminals 482, the first front-side terminals 711 are formed in the area where the panel-side terminals 480 are formed using the entire area. Consequently, the first front-side terminals 711 are formed with a wider pitch than the panel-side terminals 480. Because of this, the first front-side terminals 711 are formed with a wider pitch than that of the panel-side terminals 480. In this embodiment, in order to structure the first front-side terminals 711 as described above, it is arranged that one or a plurality of the panel-side terminals 480 are flatly overlapped with the first front-side terminals 711.

Furthermore, since the second front-side terminals 712 are, formed in an area away from the first front-side terminals 711, in accordance with the electrode pitch of the capacitors 91 mounted thereon, they are formed with a pitch considerably wider than that of the panel-side terminals 480.

In this embodiment, using the flexible board 70 structured as described above, in a manner described below, electrodes of the capacitors 91 are electrically connected with panel-side terminals 482 of the liquid crystal panel 400, and the circuit board-side terminals 781 of the circuit board 7 are connected with the I/O terminals 481 of the liquid crystal panel 400 (refer to FIG. 3). Furthermore, the surfaces of the I/O terminals 781 of the circuit board 7 are gold plated.

First of all, as shown in FIG. 13, the capacitors 91 are surface-mounted to the second front-side terminals 712 of the flexible board 70 by means of soldering.

Then, the flexible board 70 having capacitors 91 surface-mounted thereon is mounted using an anisotropic conductive material so that the rear side thereof faces the liquid crystal panel 400 (second transparent substrate 420) and overlaps with the extending area 725 of the second transparent substrate 420. As a result, the flexible board 70 is mounted on the second transparent substrate 420 while being overlapped therewith. In this state, in the flexible board 70, the area where the through holes are formed, extends past the substrate edge 428 of the second transparent substrate 420.

Furthermore, between the rear side of the flexible board 70 and the liquid crystal panel 400, the first rear-side terminals 721 are electrically connected with the I/O terminals 481 of the liquid crystal panel 400 by means of an anisotropic conductive material, and the second rear-side terminals 722 are electrically connected with the terminals 482 of the liquid crystal panel 400 by means of an anisotropic conductive material.

Then, as shown in FIG. 3, at the upper side of the circuit board 7, the electrooptical unit 100 is assembled by overlapping the first reflecting member 15, the light guide plate 12, and the liquid crystal panel 400 on top of each other. At this time, a rubber connector 60 is disposed between the flexible board 70 and the circuit board 7.

As a result, the connector electrodes of the rubber connector 60 are pressed into contact with the first front-side terminals 711 of the flexible board 70 by the elasticity, and, at the same time, also are pressed into contact with the I/O terminals 781 of the circuit board 7 by the elasticity. Accordingly, the I/O terminals 481 of the liquid crystal panel 400 and the I/O terminals 781 of the circuit board 7 are electrically connected via the first rear-side terminals 721 of the flexible board 70, the through holes 713, the first front-side terminals 711, and the connector electrodes of the rubber connector 60.

Furthermore, the capacitors 91 are electrically connected with the driver IC 490 via the second front-side terminals 712 of the flexible board 70, the through holes 713, the second rear-side terminals 721 and the terminals 482.

As described above, in the electrooptical unit 100 and the mobile phone 1 according to this embodiment, the rear-side terminals 72 (first rear-side terminals 721 and second rear-side terminals 722) of the flexible board 70 are directly connected electrically with the panel-side terminals 480, and since these rear-side terminals 72 and the panel-side terminals 480 are electrically connected by means of an anisotropic conductive material or the like, even when the panel-side terminals 480 are formed with a narrow pitch, electrical connection can be established. Furthermore, the first front-side terminals 711 of the flexible board 70 are connected with the connector electrodes of the rubber connector 60, which directly electrically connects the circuit board-side terminals 781 and the I/O terminals 481 of the liquid crystal panel 400; and the first front-side terminals 711, are formed at the front side of the flexible board 70 as described above, they can be formed with a wide pitch in accordance with the pitch of the connector electrodes. Accordingly, without being influenced by the pitch of the electrode, the I/O terminal 481 can be formed with a narrow pitch. Consequently, in the liquid crystal panel 400, since it is possible to make the area for forming the panel-side terminals 480 narrower, it is possible to make the area which does not contribute directly to the image display narrower. Furthermore, as length of the wiring for the electrode patterns is reduced, the resistance value thereof is reduced, resulting in prevention of voltage drop of the input signals.

Furthermore, in the flexible board 70, since the first rear-side terminals 721 and the first front-side terminals 711 are electrically connected with each other via the through holes 713 of the flexible board 70, it is possible to electrically connect the I/O terminals 481 and the circuit board-side terminals 781 via the flexible board 70 and the rubber connector 60. Also, in the flexible board 70, as the second rear-side terminals 722 and the second front-side terminals 712 are electrically connected via through holes 713 of the flexible board 70, it is possible to electrically connect the panel-side terminals 482 and the second front-side terminals 712 via the flexible board 70.

Furthermore, since the flexible board 70 has flexibility, unevenness in thickness of the ITO film constituting the panel-side terminals 480 is absorbed, and since the rear-side terminals 72 of the flexible board 70 are gold plated, different from a case in which the surface mount type capacitors 91 and the rubber connector 90 are directly electrically connected with the panel-side terminals 480 of the crystal liquid panel 400, disadvantages such as the initial contact resistance being large, the contact resistance increasing over time, or the like are eliminated.

That is to say, the rubber connector 60 is not compressedly directly connected to the I/O terminals 481 of the liquid crystal panel 400, but is compressedly connected to the first front-side terminals 711 of the flexible board 70 in which the first rear-side terminals 721 are electrically connected with I/O terminals 481 of the liquid crystal panel 400 satisfactorily. In this state, although it is arranged that the connector electrodes of the rubber connector 60 are compressedly connected to the front-side terminals 71 of the flexible board 70 by the elasticity only, since the front-side terminals 71 of the flexible board 70 are gold plated, in these areas where they are electrically connected, the contact resistance is small only by connecting compressedly, at the same time, resistance changes over time will hardly occur. Also, although the connector electrodes of the rubber connector 60 are structured so as to be pressed into connection with the I/O terminals 781 of the circuit board 7 by the elasticity, since the I/O terminals 781 are also plated with gold or the like, in these areas where they are electrically connected, the contact resistance is small only by being compressedly connected, and, at the same time, resistance changes over time will hardly occur. Accordingly, when a display is made using the liquid crystal panel 400, disadvantages such as the panel not illuminating or illuminating dimly, which are caused by an increase in resistance at the electrically connected areas, are eliminated.

Furthermore, since the surface mount type capacitors 91 are not directly electrically connected with the terminals 482 of the liquid crystal panel 400 by means of an anisotropic film, but are electrically connected with the second front-side terminals 712 of the flexible board 70, in which the second rear-side terminals 722 are electrically connected satisfactorily with the terminals 482 of the liquid crystal panel 400 by means of soldering, in these area where they are electrically connected, the contact resistance is small, and resistance changes over time will hardly occur.

Furthermore, in the flexible board 70, the first front-side terminals 711 to be used for connector terminals, are formed with a wide pitch, in accordance with the connector electrodes of the rubber connector 60; in the liquid crystal panel 400, as for the panel-side terminals 480, from the point of forming a plurality of terminals in a small area, the first front-side terminals 711 always overlap with one or a plurality of panel-side terminals 480 flatly. Accordingly, when mounting the terminals to the flexible board 70 of the liquid crystal panel 400 using an anisotropic conductive material, the head is applied to the upper side of the flexible board 70 and heats and presses to connect it. At this time, the first front-side terminals 711 come into contact with the head; the rear-side terminals 72 of the flexible board 70 and the panel-side terminals 480 exist under any of the first-side terminals 711. Accordingly, since the first-side terminals 711 are formed into a state in which no unevenness exists, the head applies heat and pressure evenly to every rear-side terminal 72 and the panel-side terminal 480. Consequently, between the flexible board 70 and the liquid crystal panel 400, the rear side terminals 72 and the panel-side terminals 480 are securely electrically connected.

Still furthermore, in this embodiment, the flexible board 70 is, as illustrated in FIG. 11, disposed so that the area where the through holes 713 are formed extends past the substrate edge 428 of the liquid crystal panel 400. Accordingly, the area where the through holes 713 are formed in the flexible board 70 provides a larger area for forming the front-side wiring patterns 710 and 720 in the front side and the rear side of the flexible board 70. Accordingly, after electrically connecting the panel-side terminals 480 with the rear-side terminals 72, it is easy to electrically connect with the front-side terminals 71 of the flexible board (first front-side terminals 711 and second front-side terminals 712) which are separated therefrom.

Figure 14:
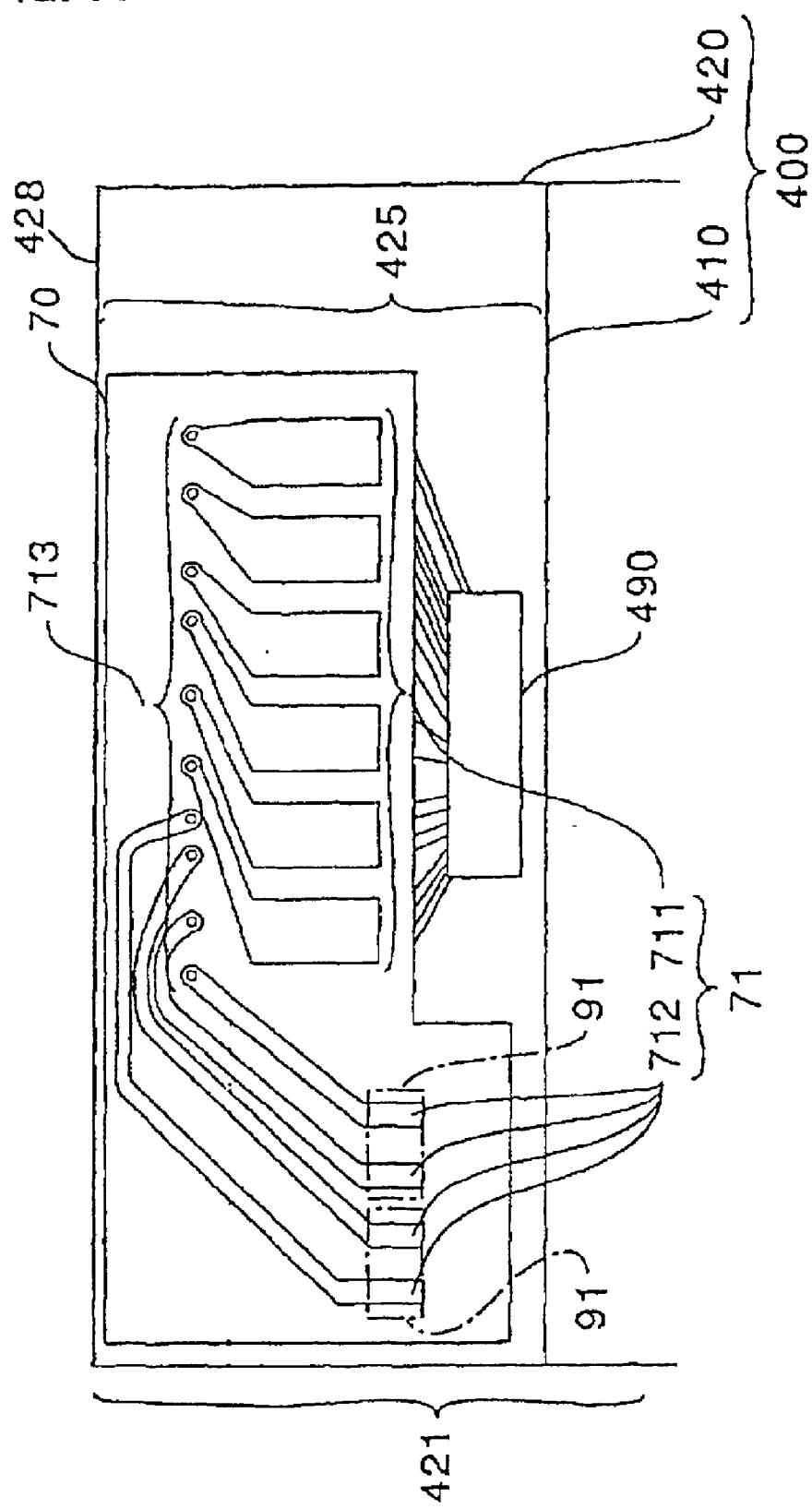
Figure 15:
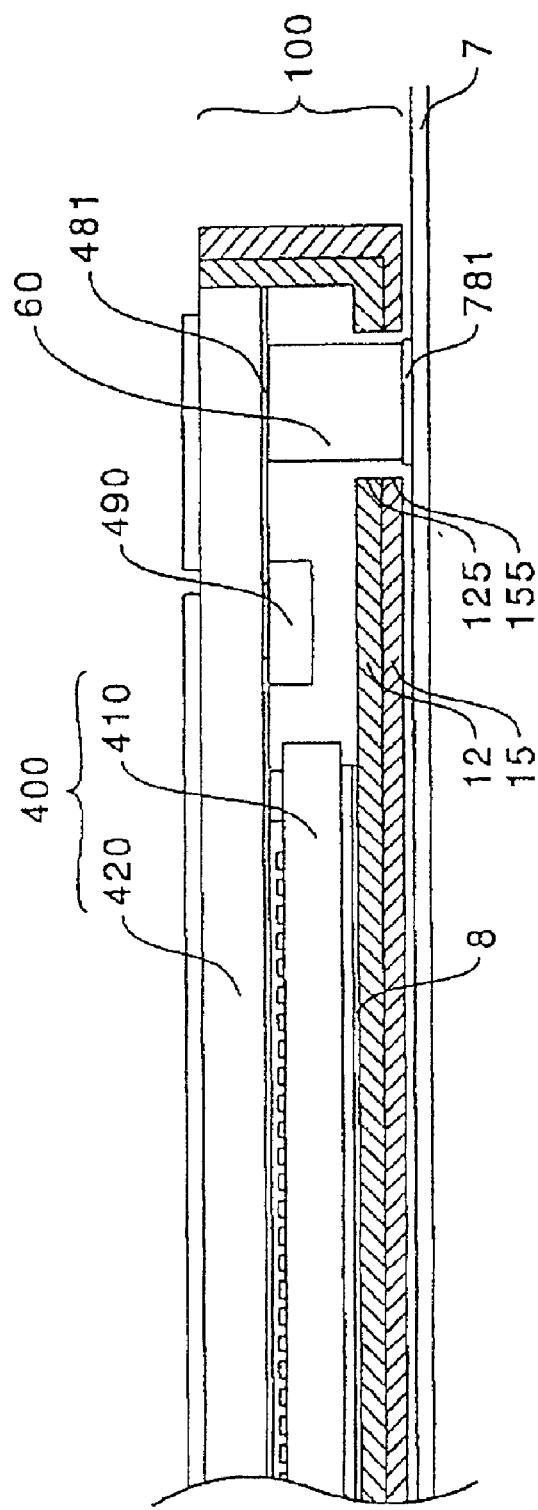
FIG. 15 is a longitudinal sectional view showing an enlarged electrooptical unit in which a circuit board, a first reflecting member, a second reflecting member, a light guide plate, a light diffusing sheet and a liquid crystal panel are overlapped on top of each other, in an electrooptical unit mounted on a conventional mobile phone.
Figure 16:
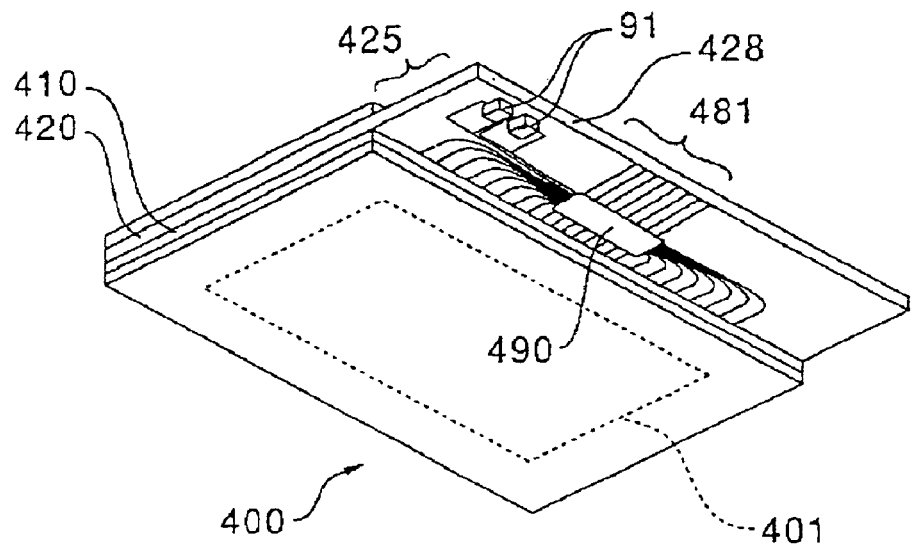
FIG. 16 is a perspective view of the liquid crystal panel viewed at an angle from the bottom, in the electrooptical unit of the mobile phone in FIG. 15.

In the second embodiment described above, it is arranged that the area formed with through holes 713 in the flexible board 70 extend past the edges (substrate edge 428 of the second transparent substrate 420) of the liquid crystal panel 400. However, as shown in FIG. 14, it may be arranged that the entire flexible board 70 overlaps the liquid crystal panel 400 including the area formed with the through holes 713. As other structures are the same as those of the second embodiment, identical portions are given identical reference numerals and the descriptions thereof are omitted.

By being structured as described above, the overall size of the electrooptical unit 100 including the liquid crystal panel 400 and the flexible board 70 can be made smaller.

In the first and second embodiments described above, although a description has been made by taking an example in which the present invention is applied to the mobile phone 1 as an electronic apparatus, the present invent may be applied to other electronic apparatuses.

Also, in the first and second embodiments, although a description has been made by taking an example in which the liquid crystal panel 400 is used as an electrooptical panel; the electrooptical panel is not limited to the liquid crystal panel 400 only, and the invention may be applied to an electronic apparatus in which an electrooptical panel of an organic electroluminescence type is used.

Further, in the first and second embodiments, although the rubber connector 60 is used as a connector, any connector providing connector electrodes that provide a connection compressedly by the elasticity may be used. For example, a connector structured so as to establish a connection compressedly by means of a recovery force of a metal spring configured in the form of a letter "L" may be used.

As described above, in an electrooptical unit and electronic apparatus according to the present invention, the rear-side terminals of the flexible board are electrically connected with the panel-side electrodes of the electrooptical panel, and the electronics components are connected electrically with the front-side terminals of the flexible board. Herein, as the flexible board has flexibility, it is possible to absorb the unevenness of the film of the panel-side terminals. Also, the terminals of the flexible board are generally gold plated. Accordingly, different from a case in which a surface mounttype capacitor and a rubber connector are directly electrically connected with the panel-side terminals, such problems such as the initial contact resistance being large, the contact resistance increasing over time, or the like are prevented.

Furthermore, the rear-side terminals of the flexible board are directly electrically connected with the panel-side terminals of the electrooptical panel; and as the rear-side terminals and the panel-side terminals are electrically connected with each other by means of an anisotropic conductive material, it is possible to establish electrical connection even when the panel-side terminals are formed with a narrow pitch. Further, the first front-side terminals formed on the front side of the flexible board are connected with the connector electrodes of the connector, which connect the circuit board and the panel-side terminals electrically; since the first front-side terminals like these are formed on the front side of the flexible board, it is possible to form them with a wide pitch in accordance with the pitch of the connector electrodes. Accordingly, as for the panel-side terminals, without being influenced by the pitch of the connector terminals, it is possible to from the same with a narrow pitch. Consequently, in the electrooptical panel, since it is possible to make the area for forming the panel-side terminals smaller, it is possible to reduce the area which does not directly contribute to the image display. Still further, in the flexible board, since the rear-side terminals and the first front-side terminals are electrically connected with each other via the through holes in the flexible board, it is possible to electrically connect the panel-side terminals and the circuit board-side terminals via the flexible board and the connector.

What is claimed is:

1. An electrooptical unit comprising:
   an electrooptical panel overlapping a circuit board with a predetermined space therebetween, said electrooptical panel including panel-side terminals facing circuit board-side terminals of said circuit board; and
   a flexible board overlapping part of said electrooptical panel, said flexible board including a plurality of front-side terminals formed on a front side thereof, a plurality of rear-side terminals formed on a rear side thereof and a plurality of through holes enabling electrical connection of said front-side terminals and said rear-side terminals, said rear-side terminals being electrically connected with said panel-side terminals via conductive material, and said front-side terminals being electrically connected to an electronic component.

2. An electrooptical unit according to claim 1, an area of said flexible board with said through holes overlaps said electrooptical panel.

3. An electrooptical unit according to claim 1, wherein all of said flexible board overlaps said electrooptical panel.

4. An electrooptical unit according to claim 1, wherein an area of said flexible board formed with said through holes extends past an edge of said electrooptical panel.

5. An electrooptical unit according to claim 1, wherein said electronic components include a connector elastically connected between first front-side terminals of said front-side terminals and said circuit board-side terminals.

6. An electrooptical unit according to claim 5, wherein a plurality of said first front-side terminals are formed at a wider pitch than a pitch of said panel-side terminals to be connected with said first front-side terminals via said through holes and said rear-side terminals.

7. An electrooptical unit according to claim 6, wherein at least one of said front-side terminals flatly overlaps at least one of said panel-side terminals flatly.

8. An electrooptical unit according to claim 1, wherein said electronic components include an electrical circuit element surface-mounted on second front-side terminals of said front-side terminals.

9. An electrooptical unit according to claim 8, wherein said electronic panel has a driver IC mounted thereon, said panel-side terminals include I/O terminals for said driver IC, and said electrical circuit element is an external element for operating said driver IC.

10. An electrooptical unit according to claim 9, wherein said external element is a surface mount type capacitor.

11. An electrooptical unit according to claim 1, wherein said electronic components include a connector having connector electrodes elastically connected to first front-side terminals of said front-side terminals and said circuit board-side terminals by being sandwiched between said flexible board and said circuit board, and an electrical circuit element surface-mounted on second front-side terminals of said front-side terminals.

12. An electrooptical unit according to claim 1, in which said electronic panel has a driver IC mounted thereon, and said panel-side terminals include I/O terminals for said driver IC.

13. An electrooptical unit according to claim 12, wherein a plurality of electrode patterns extend from an area where said driver IC is located to an image display area of said electrooptical panel.

14. An electrooptical unit according to claim 1, wherein said panel-side terminals are formed of an ITO film.

15. An electrooptical unit according to claim 1, wherein said electrooptical panel is a liquid crystal panel.

16. An electrooptical unit according of claim 1, wherein said conductive material is an anisotropic conductive material.

17. An electrooptical apparatus, comprising an electrooptical unit set forth in claim 1.

18. An electrooptical unit according to claim 1, wherein the electrooptical panel, the flexible board, and the electronic component have a common overlapping region.

19. An electrooptical unit comprising:
   an electrooptical panel including panel terminals formed thereon;
   a circuit board disposed opposite and spaced apart from said electrooptical panel, said circuit board including circuit board terminals formed thereon; and
   a flexible board disposed on said electrooptical panel, said flexible board including first terminals formed on one side of said flexible board, second terminals formed on an opposite side of said flexible board, and through holes formed through said flexible board electrically interconnecting said first and second terminals, wherein said second terminals are electrically connected to said panel terminals and said first terminals are electrically connected to an electronic component.

20. The electrooptical claim 19 further comprising a rubber connector disposed between said electrooptical panel and said circuit board, said rubber connector being elastically connected to said second terminals of said flexible board at one end and elastically connected to said circuit board terminals of said circuit board at an opposite end.

21. The electrooptical unit of claim 19 wherein an area of said flexible board containing said through holes extends beyond an edge of said electrooptical panel.

22. An electrooptical unit according to claim 19, wherein the electrooptical panel, the flexible board, and the electronic component have a common overlapping region.

23. An electrooptical unit comprising:
   an electrooptical panel including panel terminals;
   an electrical component including connector electrodes; and
   a flexible board formed with through holes, the flexible board including first terminals formed on one side of the flexible board and second terminals formed on an opposite side of the flexible board, the first terminals and the second terminals being electrically interconnected through the through holes, the first terminals being electrically connected with the connector electrodes and the second terminals being electrically connected with the panel terminals, the electrooptical panel, the flexible board, and the electronic component having a common overlapping region.

24. An electrooptical unit comprising:

an electrooptical panel including panel terminals;

an electrical component including, connector electrodes; and a flexible board formed with through holes, the flexible board including first terminals formed on one side of the flexible board and second terminals formed on an opposite side of the flexible board, the first terminals being electrically connected with the connector electrodes and the second terminals being electrically connected with the panel terminals, the first terminals and the second terminals being electrically interconnected through the through holes and overlapping each other as viewed in plan.

25. An electrooptical unit comprising:

an electrooptical panel including panel terminals;

an electrical component disposed opposite from the electrooptical panel, the electrical component including connector electrodes; and a flexible board formed therethrough with through holes and including:

first terminals formed on one side of the flexible board and electrically connected with the connector electrodes, the first terminals being formed at a wider pitch than a pitch of the panel terminals, and second terminals formed on an opposite side of the flexible board from the first terminals and electrically connected with the panel terminals, the first terminals and the second terminals being electrically interconnected through the through holes.

26. An electrooptical unit comprising:

an electrooptical panel including panel terminals;

an electrical component disposed opposite from the electrooptical panel, the electrical component including connector electrodes; and a flexible board formed therethrough with through holes and including:

first terminals formed on one side of the flexible board and electrically connected with the connector electrodes, and second terminals formed on an opposite side of the flexible board from the first terminals and electrically connected with the panel terminals, the first terminals and the second terminals being electrically interconnected through the through holes, each first terminal being formed wider than a corresponding one of the second terminals.

* * * * *

UNITED STATES PATENT AND TRADEMARK OFFICE
CERTIFICATE OF CORRECTION

PATENT NO. : 6,870,590 B2 Page 1 of 1
DATED : March 22, 2005
INVENTOR(S) : Hitoshi Shoji It is certified that error appears in the above-identified patent and that said Letters Patent is hereby corrected as shown below:

Column 10,
Line 47, "I/O" should be -- (I/O --.

Column 19,
Line 41, after "1," insert -- wherein --.

Column 20,
Line 49, after "electrooptical" insert -- unit of --.

Signed and Sealed this

Twenty-first Day of February, 2006

JON W. DUDAS
*Director of the United States Patent and Trademark Office*